United States Patent
Cho et al.

(10) Patent No.: US 11,271,017 B2
(45) Date of Patent: *Mar. 8, 2022

(54) DISPLAY DEVICE

(71) Applicant: Samsung Display Co., Ltd., Yongin-si (KR)

(72) Inventors: Seung-Hwan Cho, Yongin-si (KR); Jong Hyun Choi, Seoul (KR); Kyung-Hoon Kim, Uiwang-si (KR); Dong Hwan Shim, Hwaseong-si (KR); Seon Young Choi, Gunpo-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 190 days.

This patent is subject to a terminal disclaimer.

(21) Appl. No.: 16/588,423

(22) Filed: Sep. 30, 2019

(65) Prior Publication Data

US 2020/0027901 A1    Jan. 23, 2020

Related U.S. Application Data

(63) Continuation of application No. 15/949,938, filed on Apr. 10, 2018, now Pat. No. 10,431,604.

(30) Foreign Application Priority Data

May 11, 2017 (KR) .................. 10-2017-0058475

(51) Int. Cl.
*H01L 27/32* (2006.01)
*H01L 27/12* (2006.01)
(Continued)

(52) U.S. Cl.
CPC ......... *H01L 27/124* (2013.01); *G09G 3/3233* (2013.01); *H01L 27/1218* (2013.01);
(Continued)

(58) Field of Classification Search
CPC ............... H01L 27/1218; H01L 27/124; H01L 27/3272; H01L 27/3276; H01L 27/3297;
(Continued)

(56) References Cited

U.S. PATENT DOCUMENTS

| 8,976,141 B2 | 3/2015 | Myers et al. |
| 2007/0096135 A1 | 5/2007 | Matsumoto |

(Continued)

FOREIGN PATENT DOCUMENTS

| EP | 3174033 | 5/2017 |
| KR | 1020110049094 | 5/2011 |

(Continued)

OTHER PUBLICATIONS

Extended European Search Report—European Patent Application No. 18171450.2 dated Sep. 12, 2018.

*Primary Examiner* — Bryan R Junge
(74) *Attorney, Agent, or Firm* — Cantor Colburn LLP

(57) ABSTRACT

A display device includes: a substrate including a main display portion, edge portions disposed at edges of the main display portion and including rounded corners, first side portions bent from the edge portions, and second side portions bent from the main display portion; scan lines and data lines that are disposed on the substrate; transistors connected to the scan lines and the data lines; and a data voltage transmission line connected to data lines that are disposed in the first side portions and the edge portions.

18 Claims, 16 Drawing Sheets

(51) Int. Cl.
  *H01L 27/15* (2006.01)
  *G09G 3/3233* (2016.01)
  *G09G 3/36* (2006.01)
  *G09G 3/3241* (2016.01)
  *H01L 51/00* (2006.01)

(52) U.S. Cl.
  CPC ...... *H01L 27/1244* (2013.01); *H01L 27/1248* (2013.01); *H01L 27/156* (2013.01); *H01L 27/3272* (2013.01); *H01L 27/3276* (2013.01); *G09G 3/3241* (2013.01); *G09G 3/3648* (2013.01); *G09G 2300/0413* (2013.01); *G09G 2300/0426* (2013.01); *G09G 2300/0819* (2013.01); *G09G 2300/0842* (2013.01); *G09G 2300/0861* (2013.01); *G09G 2310/0262* (2013.01); *G09G 2320/0209* (2013.01); *G09G 2320/0219* (2013.01); *H01L 51/0097* (2013.01); *H01L 2251/5338* (2013.01)

(58) Field of Classification Search
  CPC ........ H01L 2251/5338; H01L 51/0097; G09G 3/3225–3258
  See application file for complete search history.

(56) References Cited

U.S. PATENT DOCUMENTS

| | | | |
|---|---|---|---|
| 2010/0109993 A1* | 5/2010 | Chang | G02F 1/1345 345/92 |
| 2012/0218219 A1 | 8/2012 | Rappoport et al. | |
| 2013/0127373 A1 | 5/2013 | Yamamoto et al. | |
| 2015/0138041 A1 | 5/2015 | Hirakata et al. | |
| 2015/0270323 A1 | 9/2015 | Cho et al. | |
| 2015/0302811 A1 | 10/2015 | Park | |
| 2017/0288006 A1 | 10/2017 | Yang et al. | |

FOREIGN PATENT DOCUMENTS

| | | | |
|---|---|---|---|
| KR | 1020140099139 | 8/2014 | |
| KR | 1020150001019 | 1/2015 | |
| WO | 2016033704 | 3/2016 | |
| WO | WO-2016033704 A1 * | 3/2016 | ............. G09F 9/301 |
| WO | 2016053252 | 4/2016 | |
| WO | 2017127563 | 7/2017 | |

* cited by examiner

DISPLAY DEVICE

RELATED APPLICATIONS

This application is a continuation application of U.S. patent application Ser. No. 15/949,938, filed on Apr. 10, 2018, which claims priority to Korean Patent Application No. 10-2017-0058475, filed on May 11, 2017, and all the benefits accruing therefrom under 35 U.S.C. § 119, the content of which in its entirety is herein incorporated by reference.

BACKGROUND

1. Field

Exemplary embodiments of the disclosure relates to a display device.

2. Description of the Related Art

Various electronic devices, such as a portable telephone, a navigation device, a digital camera, an electronic book, a portable game device and various terminals, where a liquid crystal display ("LCD") or an organic light emitting diode ("OLED") display is applied as a display device, have been widely used.

Conventionally, such a display device is generally in the shape of a rectangle, but recently, a display device having a rounded corner, and a display device where an image is displayed on a side portion of the display device, have been researched and developed.

SUMMARY

In a display device displaying an image on a side portion thereof, a non-display area may be increased due to a signal line therein for transmission of a video signal to the rounded corner, the side portion and the like, and a light emission area may be reduced.

Exemplary embodiments relate to a display device in which a light emission area is prevented from being reduced.

An exemplary embodiment of a display device includes: a substrate including a main display portion, edge portion disposed at one of edges of the main display portion and a first side portion bent from the edge portion, scan lines disposed on the substrate, data lines disposed on the substrate, transistors connected to the scan lines and the data lines, and a data voltage transmission line connected to a data line disposed in the first side portion and disposed on both the edge portion and the main display portion.

The substrate may further comprise a second side portion bent from the main display portion.

In an exemplary embodiment, the display device may further include a driving circuit portion connected to the second side portion, where the data voltage transmission line may be connected between the driving circuit portion and the data line.

In an exemplary embodiment, the first side portion may extend in a first direction, and the second side portions may extend in a second direction.

In an exemplary embodiment, the data lines may extend in the first direction, the data voltage transmission line may extend in the second direction in the first side portion, and, the data voltage transmission line may extend along the edge portion.

In an exemplary embodiment, the edge portion may include a rounded corner, and the data voltage transmission line may extend along an rounded edge of the rounded corner at the edge portion.

In an exemplary embodiment, the data voltage transmission line may includes a first portion and a second portion which is disposed on a different layer from the first portion.

In an exemplary embodiment, the display device may further comprise an insulation layer disposed between the first portion and the second portion.

In an exemplary embodiment, the data line and the data voltage transmission line may be disposed in different layers from each other.

In an exemplary embodiment, the display device may further include an insulation layer disposed between the data line and the data voltage transmission line, where a contact hole may be defined in the insulation layer, and the data voltage transmission line may be connected to the data line through the contact hole.

In an exemplary embodiment, the display device may further include: driving voltage lines disposed on the substrate; and driving voltage transmission lines connected to the driving voltage lines.

In an exemplary embodiment, the driving voltage transmission lines may extend in a direction parallel with the driving voltage lines.

In an exemplary embodiment, the driving voltage transmission lines may overlap the driving voltage lines.

In an exemplary embodiment, the display device may further include: an insulation layer disposed between the driving voltage transmission line and the driving voltage line, where a contact hole may be defined in the insulation layer, and the driving voltage transmission line may be connected to the driving voltage line through the contact hole.

In an exemplary embodiment, the data voltage transmission line and the driving voltage transmission line may be disposed in a same layer as each other.

In an exemplary embodiment, the display device may further include a shield layer disposed between the transistor and the data voltage transmission line.

In an exemplary embodiment, the display device may include a driving voltage line disposed between the substrate and the shield layer, wherein the shield layer may be connected to the driving voltage line.

In an exemplary embodiment, the display device may further include: a first insulation layer disposed between the driving voltage line and the shield layer, where a first contact hole may be defined in the first insulation layer, and the shield layer may be connected to the driving voltage line through the first contact hole.

In an exemplary embodiment, the display device may further include: a second insulation layer disposed between the shield layer and the data voltage transmission line, where a second contact hole may be defined in the first insulation layer and the second insulation layer, and the data voltage transmission line may be connected to the data line through the second contact hole.

In an exemplary embodiment, an opening may be defined in the shield layer, and the opening may surround the second contact hole.

In an exemplary embodiment, the display device may further include: a plurality of driving voltage lines disposed on the substrate; and a driving voltage transmission line which connects the plurality of driving voltage lines to each other.

In an exemplary embodiment, the driving voltage transmission line may cross the plurality of driving voltage lines and may extend in parallel with the data voltage transmission line.

In an exemplary embodiment, the display device may further include a shield pattern disposed adjacent to the data voltage transmission line and connected to at least one of the plurality of driving voltage lines.

In an exemplary embodiment, the display device may further include a dummy pattern which overlaps the data lines and is connected to the data lines.

According to exemplary embodiments, data voltage transmission lines that are connected to the data lines are provided in rounded corners to transmit signals to the data lines such that the light emission area in the rounded corners may be prevented from being reduced.

BRIEF DESCRIPTION OF THE DRAWINGS

The above and other features of the invention will become more apparent by describing in further detail exemplary embodiments thereof with reference to the accompanying drawings, in which.

DETAILED DESCRIPTION

Figure 1:
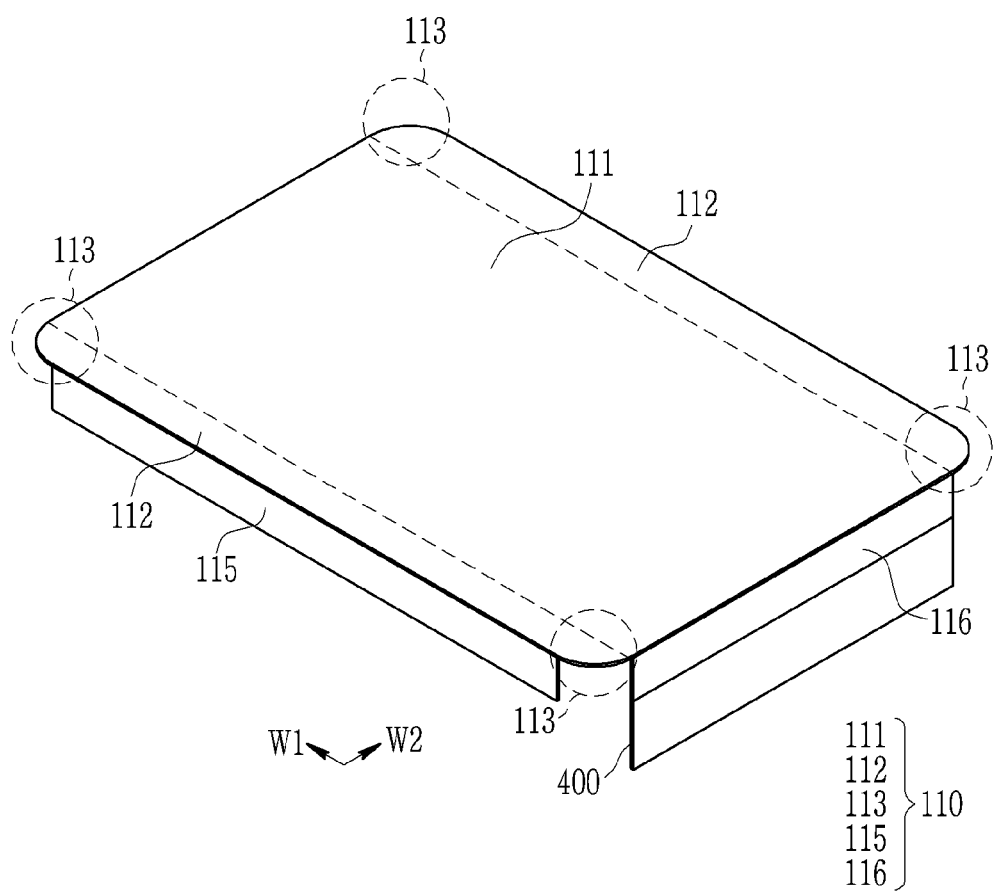
FIG. 1 is a perspective view of a display device according to an exemplary embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, the word "over" or "on" means positioning on or below the object portion, but does not essentially mean positioning on the upper side of the object portion based on a gravity direction.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Herein, the phrase "on a plane" means when viewing a target portion from the top or on a top plan view, and the phrase "on a cross-section" means when viewing a cross-section formed by vertically cutting a target portion from a side.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the invention will be described in detail with reference to the accompanying drawings.

Figure 2:
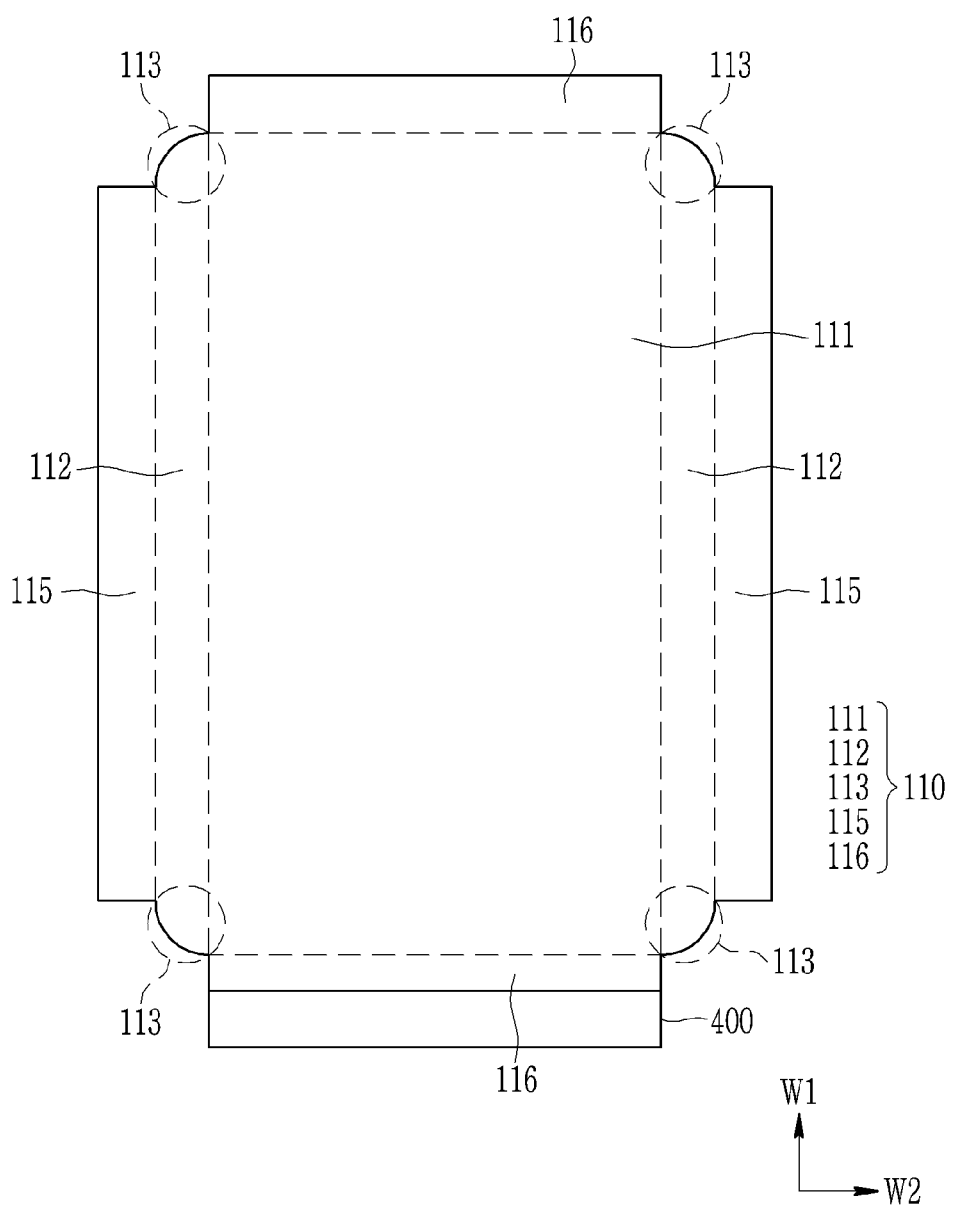
FIG. 2 is a diagram of the display device of FIG. 1 in an unfolded state.
Figure 3:
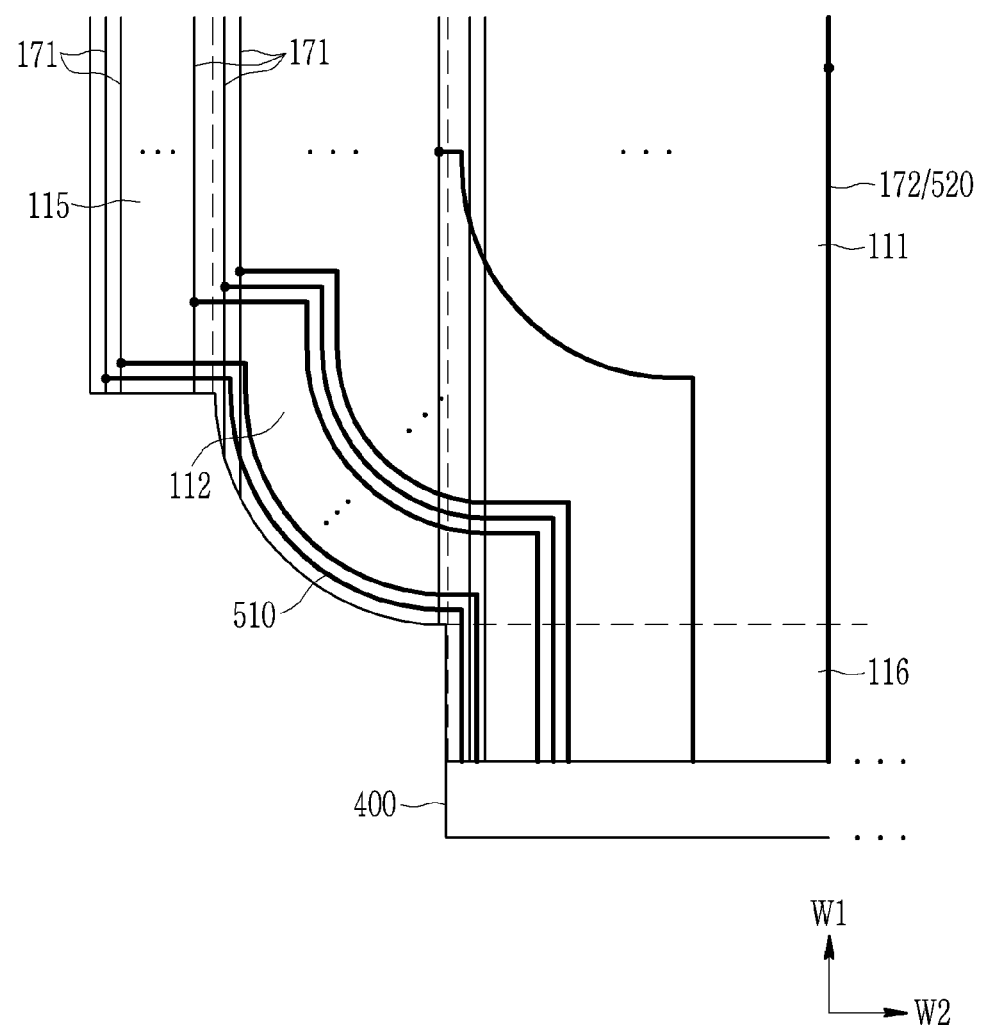
FIG. 3 is an enlarged view of a part of FIG. 2.

FIG. 1 is a perspective view of a display device according to an exemplary embodiment, FIG. 2 is a diagram of the display device of FIG. 1 in an unfolded view, and FIG. 3 is an enlarged view of a part of FIG. 2.

As shown in FIG. 1 and FIG. 2, an exemplary embodiment of a display device includes a substrate 110 that includes a main display portion 111, edge portions 112 that are disposed at edges of the main display portion 111, first side portions 115 that are bent from the edge portions 112, and second side portions 116 that are bent from the main display portion 111.

The main display portion 111 is disposed in a center portion of the substrate 110, and may be in the shape of a polygon. In one exemplary embodiment, for example, as shown in FIGS. 1 and 2, the main display portion 111 may be in the shape of a quadrangle. In such an embodiment, the main display portion 111 may be in the shape of a rectangle including two sides extending in a first direction W1 and two sides extending in a second direction W2. In such an embodiment, the length of the two sides extending in the first direction W1 may be longer than the length of the two sides extending in the second direction W2.

The edge portions 112 are disposed at opposite edges of the main display portion 111. In one exemplary embodiment, for example, as shown in the drawing, the edge portions 112 may define the left edge and the right edge of the main display portion 111. The edge portions 112 extend in the first direction W1. The edge portions 112 include rounded corners 113.

The first side portions 115 are bent from the edge portions 112. In an exemplary embodiment, the first side portions 115 extend from portions of the edge portions 112, excluding the rounded corners 113. Thus, no side portion extends from the rounded corners 113 of the first side portions 115. The first side portions 115 may extend in the first direction W1.

The second side portions 116 are bent from the main display portion 111. In one exemplary embodiment, for example, as shown in FIGS. 1 and 2, the second side portions 116 are bent from the two sides of the main display portion 111 extending in a second direction W2, that is, the top edge and the bottom edge of the main display portion 111. However, the invention is not limited thereto. In an alternative embodiment, the edge portions 112 may be disposed in the top edge and the bottom edge of the main display portion 111, and the second side portions 116 may be bent from the left edge and the right edge of the main display portion 111. In an exemplary embodiment, as show in FIGS. 1 and 2, the second side portions 116 extend in the second direction W2.

In an exemplary embodiment, as shown in FIG. 3, a plurality of signal lines 171, 172, 510 and 520 are disposed on the substrate 110. Signals for driving the display device are applied to the signal lines 171, 172, 510 and 520. Data lines 171 that transmit a data signal and a driving voltage line 172 that transmits a driving voltage are disposed on the substrate 110. The data lines 171 and the driving voltage line 172 extend in the first direction W1.

A data voltage transmission line 510 that transmits a data signal is disposed on the substrate 110. The data voltage transmission line 510 connects the data lines 171 and a driving circuit portion 400. The data voltage transmission line 510 is connected to data lines 171 that are disposed in the first side portions 115 and the edge portions 112 of the substrate 110. The data voltage transmission line 510 extends in the second direction W2 in the first side portions 115, and extends along the rounded edge of the rounded corner 113 in the edge portions 112. In such an embodiment, the data voltage transmission line 510 may be rounded in the edge portions 112. The data voltage transmission line 510 extends in the second direction W2 from the edge portions 112 to the main display portion 111, and bent in the first direction W1 from the main display portion 111 to the second side portions 116.

A driving voltage transmission line 520 that transmits a driving voltage is further disposed on the substrate 110. The driving voltage transmission line 520 may extend in parallel with the driving voltage line 172, and may overlap the driving voltage line 172. The driving voltage transmission line 520 may reduce resistance of the driving voltage line 172 by being connected therewith.

In an exemplary embodiment, the display device includes the driving circuit portion 400 that generates signals to be applied to the signal lines 171, 172, 510 and 520. The driving circuit portion 400 may include a data driving portion that generates a data signal and transmits the data signal to the data lines 171 and the data voltage transmission line 510. The driving circuit portion 400 is connected to the second side portions 116 of the substrate 110. However, the invention is not limited thereto. In an alternative exemplary embodiment, the driving circuit portion 400 may be disposed on the second side portion 116 of the substrate 110. The driving circuit portion 400 may be in the form of an integrated circuit ("IC") chip and be attached on the second side portion 116.

In an exemplary embodiment, where side portions are formed by being bent after being extended from the rounded corners 113 of the substrate 110 of the display device, the data lines 171 may be disposed in the side portions. In such an embodiment, the data lines 171 in the side portions may be connected to the data driving portion of the driving circuit portion 400. Wrinkles may occur when the side portions are bent from the rounded corners 113. In an exemplary embodiment, side portions that are adjacent to the rounded corners 113 are removed to prevent such an occurrence of wrinkles. When the data lines 171 in the side portions that are adjacent to the rounded corners 113 are moved to the rounded corners 113 by removing side portions that are adjacent to the rounded corners 113, a light emission area of the rounded corner 113 may be reduced. In an exemplary embodiment, the data voltage transmission line 510 that is connected to the driving circuit portion 400 is disposed in a layer that is different from a layer where the data lines 171 are disposed, and the data voltage transmission line 510 is connected to the data line 171 that is disposed in the first side portion 115 and the edge portion 112 such that the light emission area of the rounded corner 113 may be effectively prevented from being reduced.

In an exemplary embodiment, a plurality of pixels is disposed on the substrate 110 of a display device. Hereinafter, an exemplary embodiment of a pixel of the pixels of the display device will be described with reference to FIG. 4.

Figure 4:
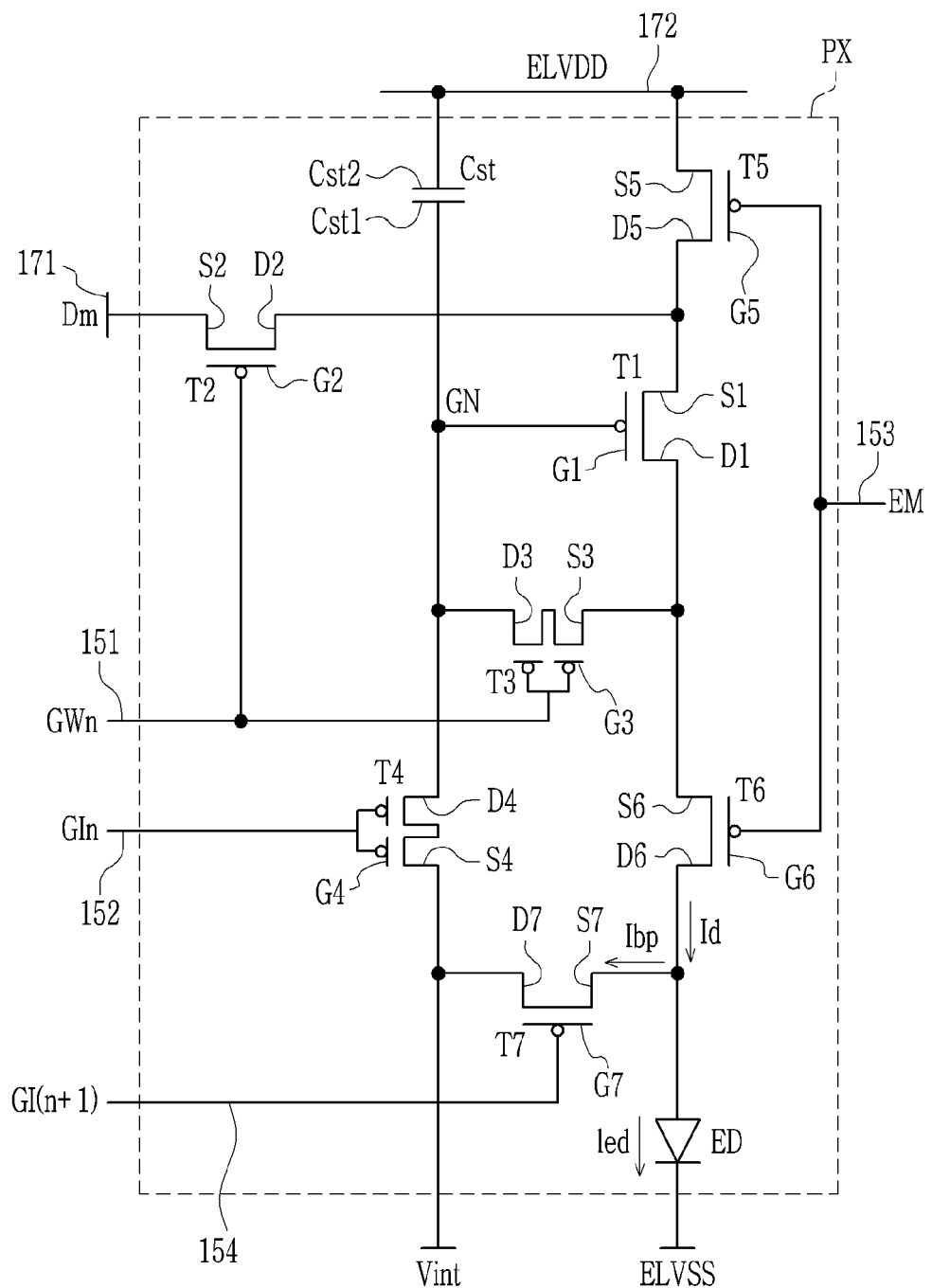
FIG. 4 is an equivalent circuit diagram of a pixel of the display device according to an exemplary embodiment.

FIG. 4 is an equivalent circuit diagram of a pixel of a display device according to an exemplary embodiment.

In an exemplary embodiment, as shown in FIG. 4, a display device includes a plurality of pixels PX that displays an image corresponding to a video signal, and a plurality of signal lines 151, 152, 153, 154, 171 and 172. Each pixel PX may include a plurality of transistors T1, T2, T3, T4, T5, T6 and T7 that are connected to the plurality of signal lines 151, 152, 153, 154, 171 and 172, a capacitor Cst, and a light emitting diode ED. Hereinafter, for convenience of description, an exemplary embodiment, in which each pixel PX includes a single light emitting diode ED, will be described in detail, but not being limited thereto. In an alternative exemplary embodiment, each pixel PX includes two or more light emitting diodes.

The signal lines 151, 152, 153, 154, 171 and 172 may include a plurality of scan lines 151, 152 and 154, a plurality of control lines 153, a plurality of data lines 171, and a plurality of driving voltage lines 172.

The plurality of scan lines 151, 152 and 154 may respectively transmit scan signals GWn, GIn and GI(n+1). The scan signals GWn, GIn and GI(n+1) may transmit a gate on voltage and a gate off voltage that can turn on and turn off the transistors T2, T3, T4 and T7 included in each pixel PX.

The scan lines 151, 152 and 154 that are connected to one pixel PX may include a first scan line 151 that transmits the scan signal GWn, a second scan line 152 that has a gate on voltage at a different time from those of the first scan line 151 and a third scan line 154, which transmits the scan signal GI(n+1). Hereinafter, for convenience of description, an exemplary embodiment, in which the second scan line 152 transmits a gate on voltage at a time prior to the first scan line 151 will be described in detail. In one exemplary embodiment, for example, the scan signal GWn is an n-th scan signal Sn (here, n is a natural number of greater than 1) among scan signals applied during one frame period, the scan signal GIn may be a previous scan signal such as an (n−1)-th scan signal S(n−1), and the scan signal GI(n+1) may be an n-th scan signal Sn, but not being limited thereto. In an alternative exemplary embodiment, the scan signal GI(n+1) may be a scan signal other than the n-th scan signal Sn.

The control line 153 may transmit a control signal, e.g., an emission control signal that controls emission of the light emitting diode ED included in the pixel PX. The control signal transmitted by the control line 153 may transmit a gate on voltage and a gate off voltage, and may have a waveform that is different from that of scan signals transmitted by the scan lines 151, 152 and 154.

The data lines 171 may transmit a data signal Dm, and the driving voltage line 172 may transmit a driving voltage ELVDD. The data signal Dm may have a voltage level that varies according to a video signal input to the display device, and the driving voltage ELVDD may have a substantially constant voltage level.

In an exemplary embodiment, as shown in FIG. 4, the transistors T1, T2, T3, T4, T5, T6 and T7 in each pixel PX may include a first transistor T1, a second transistor T2, a third transistor T3, a fourth transistor T4, a fifth transistor T5, a sixth transistor T6 and a seventh transistor T7.

In such an embodiment, the first scan line 151 may transmit a scan signal GWn to the second transistor T2 and the third transistor T3, the second scan line 152 may transmit a scan signal GIn to the fourth transistor T4, the third scan line 154 may transmit a scan signal GI(n+1) to the seventh transistor T7, and the control line 153 may transmit an emission control signal EM to the fifth transistor T5 and the sixth transistor T6.

A gate electrode G1 of the first transistor T1 is connected to a first end Cst1 of the capacitor Cst through a driving gate node GN, a source electrode S1 of the first transistor T1 is connected to the driving voltage line 172 via the fifth transistor T5, and a drain electrode D1 of the first transistor T1 is electrically connected to an anode of the light emitting diode ED via the sixth transistor T6. The first transistor T1 receives the data signal Dm transmitted from the data line 171 according to a switching operation of the second transistor T2, and supplies a driving current Id to the light emitting diode ED.

A gate electrode G2 of the second transistor T2 is connected to the first scan line 151, a source electrode S2 of the second transistor T2 is connected to the data line 171, and a drain electrode D2 of the second transistor T2 is connected to the driving voltage line 172 via the fifth transistor T5 while being connected to the source electrode S1 of the first transistor T1. The second transistor T2 is turned on by the scan signal GWn received through the first scan line 151, and transmits the data signal Dm received from the data line 171 to the source electrode S1 of the first transistor T1.

A gate electrode G3 of the third transistor T3 is connected to the first scan line 151, and a source electrode S3 of the third transistor T3 is connected to the anode of the light emitting diode ED via the sixth transistor T6 while being connected to the drain electrode D1 of the first transistor T1. A drain electrode D3 of the third transistor T3 is connected to a drain electrode D4 of the fourth transistor T4, the first end Cst1 of the capacitor Cst, and the gate electrode G1 of the first transistor T1. The third transistor T3 is turned on according to the scan signal GWn received through the first scan line 151, and diode-connects the first transistor T1 by connecting the gate electrode G1 and the drain electrode D1 of the first transistor T1 to each other.

A gate electrode G4 of the fourth transistor T4 is connected to the second scan line 152, a source electrode S4 of the fourth transistor T4 is connected to an initialization voltage (Vint) terminal, and a drain electrode D4 of the fourth transistor T4 is connected to the first end Cst1 of the capacitor Cst and the gate electrode G1 of the first transistor T1 through the drain electrode D3 of the third transistor T3. The fourth transistor T4 is turned on according to the scan signal GIn received through the second scan line 152, and transmits the initialization voltage Vint to the gate electrode G1 of the first transistor T1 for performing an initialization operation to initialize a voltage of the gate electrode G1 of the first transistor T1.

A gate electrode G5 of the fifth transistor T5 is connected to the control line 153, a source electrode S5 of the fifth transistor T5 is connected to the driving voltage line 172, and a drain electrode D5 of the fifth transistor T5 is connected to the source electrode S1 of the first transistor T1 and the drain electrode D2 of the second transistor T2.

A gate electrode G6 of the sixth transistor T6 is connected to the control line 153, a source electrode S6 of the sixth transistor T6 is connected to the drain electrode D1 of the first transistor T1 and the source electrode S3 of the third transistor T3, and a drain electrode D6 of the sixth transistor T6 is electrically connected to the anode of the light emitting diode ED. The fifth transistor T5 and the sixth transistor T6 are simultaneously turned on according to the light emission control signal EM received through the control line 153, and thus the driving voltage ELVDD is compensated by the diode-connected first transistor T1 through the turned-on fifth and sixth transistors T5 and T6, and then the compensated driving voltage ELVDD is transmitted to the light emitting diode ED.

A gate electrode G7 of the seventh transistor T7 is connected to the third scan line 154, a source electrode S7 of the seventh transistor T7 is connected to the drain electrode D6 of the sixth transistor T6 and the anode of the light emitting diode ED, and a drain electrode D7 of the seventh transistor T7 is connected to the initialization voltage (Vint) terminal and the source electrode S4 of the fourth transistor T4. Alternatively, the gate electrode G7 of the seventh transistor T7 may be connected to an additional control line (not shown).

In an exemplary embodiment, the transistors T1, T2, T3, T4, T5, T6 and T7 are P-type channel transistors such as a P-type metal-oxide-semiconductor ("PMOS") transistor and the like, but not being limited thereto. In an alternative exemplary embodiment, at least one of the transistors T1, T2, T3, T4, T5, T6 and T7 may be an N-type transistor.

In an exemplary embodiment, as described above, the first end Cst of the capacitor Cst is connected to the gate electrode G1 of the first transistor T1 and a second end Cst2 is connected to the driving voltage line 172. A cathode of the light emitting diode ED is connected to a common voltage (ELVSS) terminal that transmits a common voltage ELVSS and receives the common voltage ELVSS.

In exemplary embodiments, the structure of the pixel PX is not limited to the structure shown in FIG. 4, and the number of transistors and the number of capacitors included in each pixel PX and a relationship therebetween may be variously modified.

An operation of the display device according to the exemplary embodiment will be described with reference to FIG. 5, together with FIG. 4. Hereinafter, an operation during one frame period of an exemplary embodiment the display device, where the transistors T1, T2, T3, T4, T5, T6 and T7 of each pixel thereof are P-type channel transistors, will now be described.

Figure 5:
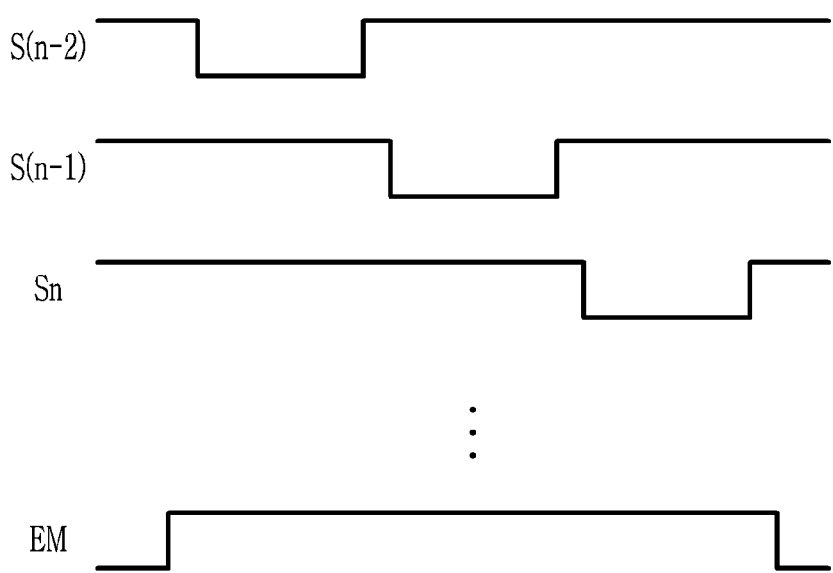
FIG. 5 is a timing diagram of driving signals of the display device according to an exemplary embodiment.

FIG. 5 is a timing diagram of driving signals of the display device according to an exemplary embodiment.

As shown in FIG. 5, low-level scan signals . . . , S(n−2), S(n−1), Sn, . . . may be sequentially applied to the plurality of first scan lines 151 connected to the plurality of pixels PX in one frame period.

During an initialization period, a low-level scan signal GIn is supplied through the second scan line 152. The scan signal GIn may be, for example, an (n−1)-th scan signal S(n−1). Then, the fourth transistor T4 is turned on corresponding to the low-level scan signal GIn, and the initialization voltage Vint is transmitted to the gate electrode G1 of the first transistor T1 through the turned-on fourth transistor T4, and the first transistor T1 is thereby initialized by the initialization voltage Vint.

Next, when a low-level scan signal GWn is supplied through the first scan line 151 during a data programming period and a compensation period, the second transistor T2 and the third transistor T3 are turned on in response to the low-level scan signal GWn. The scan signal GWn may be, for example, an n-th scan signal Sn. In such an embodiment, the first transistor T1 is diode-connected by the turned-on transistor T3 and thus biased in a forward direction. Then, a compensation voltage (Dm+Vth) that is reduced by an amount of a threshold voltage (Vth) of the first transistor T1 from the data signal Dm supplied from the data line 171 is applied to the gate electrode G1 of the first transistor T1. That is, a gate voltage applied to the gate electrode G1 of the first transistor T1 may be the compensation voltage (Dm+Vth). Here, the threshold voltage (Vth) has a negative (−) value.

The driving voltage ELVDD and the compensation voltage (Dm+Vth) are applied to opposite ends of the capacitor Cst, and a charge that corresponds to a voltage difference between the opposite ends of the capacitor Cst may be stored therein.

Next, the light emission control signal EM supplied from the control line 153 is changed to low level from high level during a light emission period. A time, at which the light emission control signal EM is changed to the low level from the high level, may be after a time of application of the scan signal GWn to all the first scan lines 151 in one frame period. Then, the fifth transistor T5 and the sixth transistor T6 are turned on by the low level of the light emission control signal EM during the light emission period. Thus, a driving current Id corresponding to a voltage difference between the gate voltage of the gate electrode G1 of the first transistor T1 and the driving voltage ELVDD is generated, and the driving current Id is supplied to the light emitting diode ED through the sixth transistor T6 such that a current led flows to the light emitting diode ED. A gate-source voltage (Vgs) of the first transistor T1 is maintained at (Dm+Vth)−ELVDD by the capacitor Cst during the light emission period, and according to a current-voltage relationship of the first transistor T1, the driving current Id may be proportional to a square $(Dm-ELVDD)^2$ of a value acquired by subtracting a threshold voltage from the driving gate-source voltage. Accordingly, the driving current Id may be determined independently of the threshold voltage Vth of the first transistor T1.

In such an embodiment, during an initialization period, the seventh transistor T7 is turned on by receiving a low level of the scan signal GI(n+1) through the third scan line 154. The scan signal GI(n+1) may be an n-th scan signal Sn. In such an embodiment, the seventh transistor T7 may be simultaneously turned on with the second and third transistors T2 and T3. A part of the driving current Id may be drawn out through the seventh transistor T7 as a bypass current Ibp by the turned-on seventh transistor T7.

A structure of a part of an exemplary embodiment of the display device will now be described in detail with reference to FIG. 6 to FIG. 8, together with FIG. 4 and FIG. 5.

For convenience of understanding and description, a plane structure of the display device will be described first and then a cross-sectional structure will be described.

Figure 6:
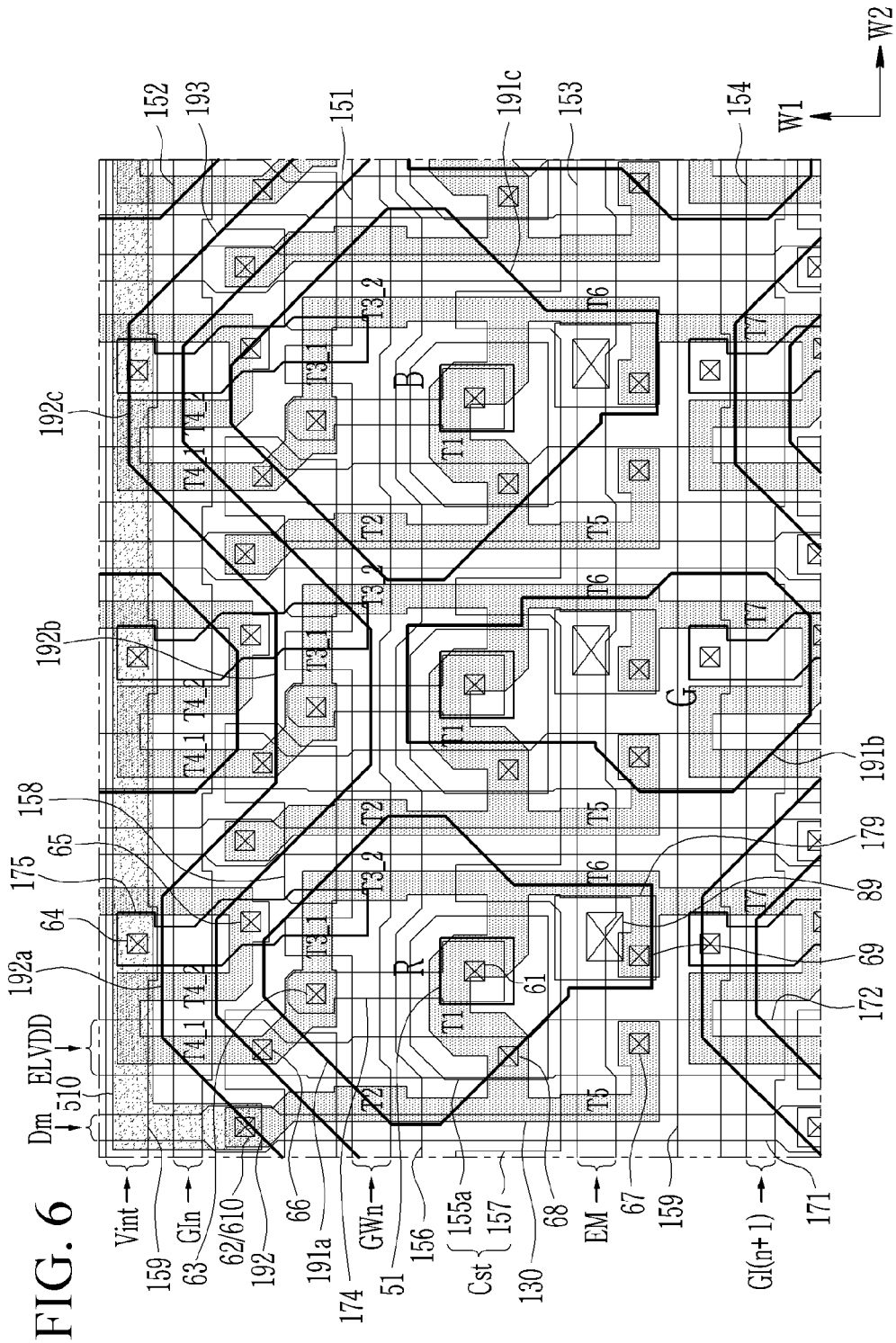
FIG. 6 is a top plan view of a plurality of pixels that neighbor each other of the display device according to an exemplary embodiment.
Figure 7:
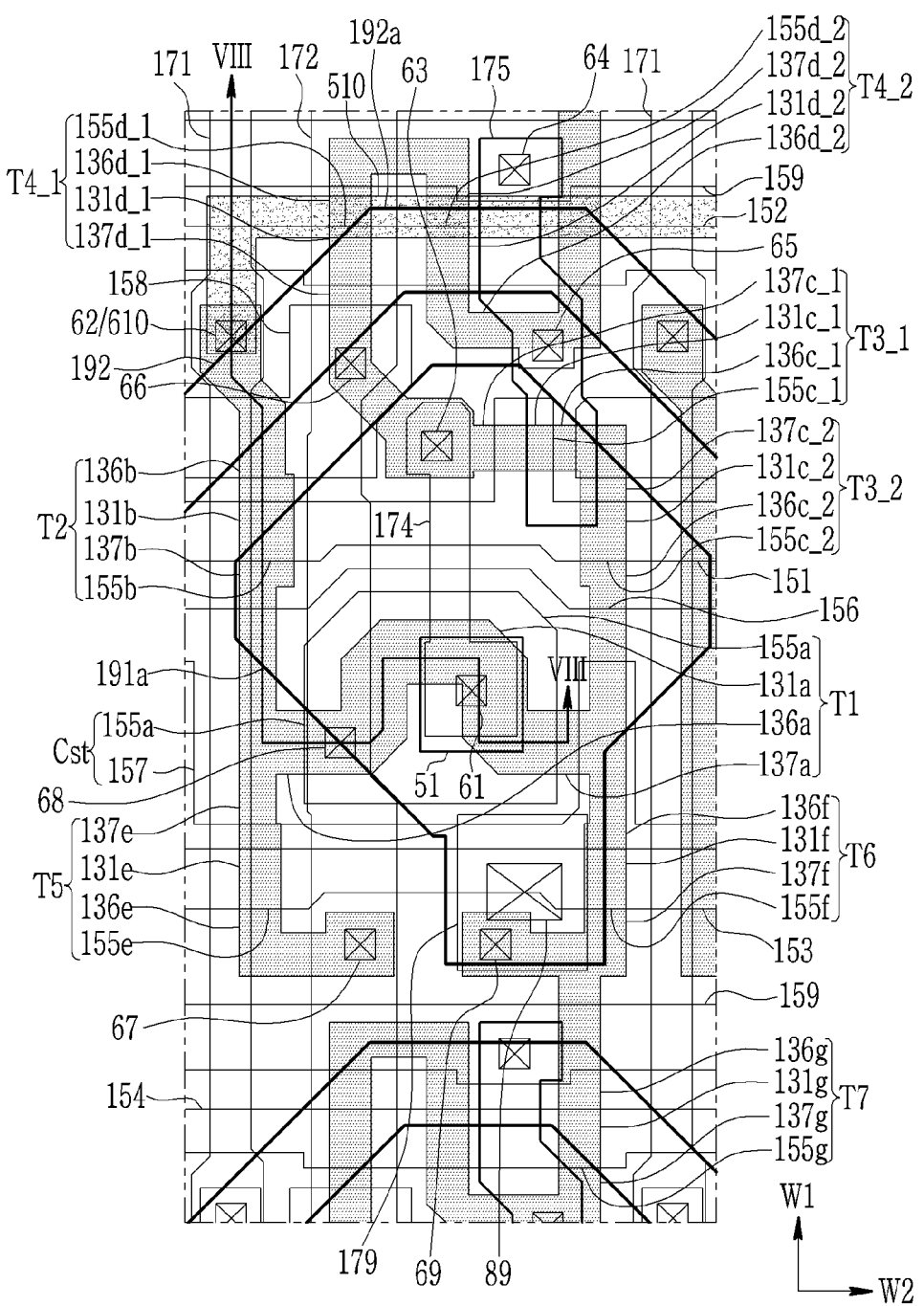
FIG. 7 is a top plan view of one of the pixels of FIG. 6.
Figure 8:
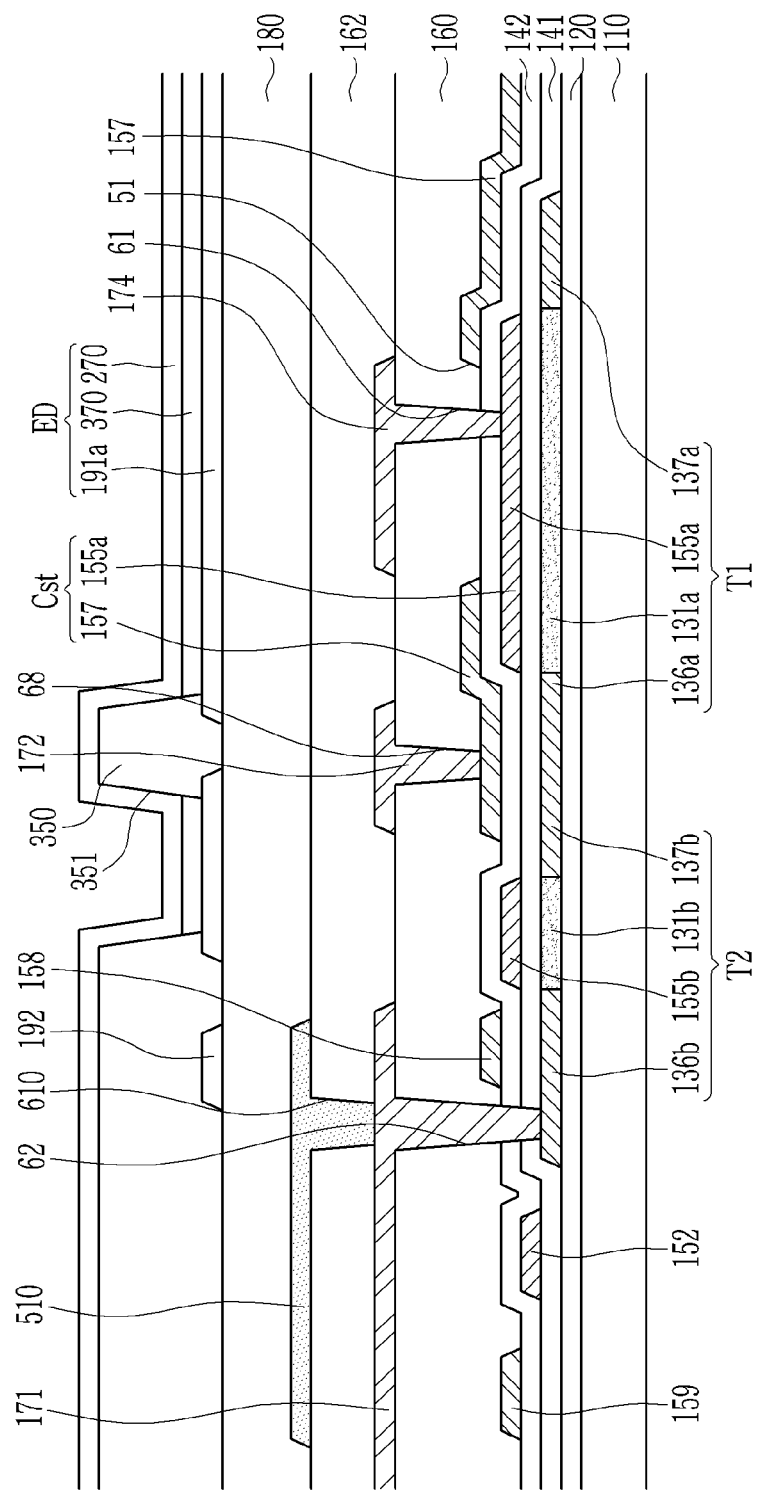
FIG. 8 is a cross-sectional view taken along line VIII-VIII of FIG. 7.

FIG. 6 is a top plan view of a plurality of pixels that are adjacent to each other in the display device according to an exemplary embodiment, FIG. 7 is a top plan view of a pixel of the plurality of pixels of FIG. 6, and FIG. 8 is a cross-sectional view taken along line VIII-VIII of FIG. 7. FIGS. 6 to 8 show a pixel that is disposed in the first side portions 115 (refer to FIG. 3) and the edge portions 112 (refer to FIG. 3) of the substrate 110.

In an exemplary embodiment, each of the plurality of pixels PX included in the display device may display a predetermined color. The plurality of pixels may, for example, include a red pixel R that displays a red color, a green pixel G that displays a green color, and a blue pixel B that displays a blue color. FIG. 6 shows an exemplary embodiment, where a red pixel R, a green pixel G, and a blue pixel B that are adjacent to each other. Alternatively, at least one of the red pixel R, the green pixel G, and the blue pixel B may display another color. In another alternative exemplary embodiment, a pixel that may display a color other than red, green, and blue may be included.

In an exemplary embodiment, the display device may include a first conductive layer that includes the first scan line 151 that transmits the scan signal GWn, the second scan line 152 that transmits the scan signal GIn, the third scan line 154 that transmits the scan signal GI(n+1), and the control line 153 that transmits the light emission control signal EM. The first conductive layer is disposed on one side of the substrate 110 on a cross-section. In such an embodiment, the first scan line 151, the second scan line 152, the third scan line 154 and the control line 153 may include a same material as each other, and may be disposed in (or directly on) a same layer as each other.

The substrate 110 may include an inorganic insulation material or an organic insulation material, such as glass, plastic and the like, and may have various degrees of flexibility.

The plurality of scan lines 151, 152 and 154, and the control line 153 may extend substantially in the second direction W2 on a plane. The first scan line 151 may be disposed between the second scan line 152 and the control line 153 on a plane. In a view of the entire display device, the third scan line 154 may substantially transmit the next scan signal GI(n+1) of the scan signal GIn that is transmitted by the second scan line 152. As described above, when the first scan line 151 transmits the n-th scan signal Sn, the third scan line 154 may also transmit the n-th scan signal Sn.

In an exemplary embodiment, the display device may further include a second conductive layer that includes a storage line 156 and an initialization voltage line 159. The second conductive layer is disposed on a layer that is different from the first conductive layer on a cross-section. In one exemplary embodiment, for example, the second conductive layer may be disposed on the first conductive layer on a cross-section. In such an embodiment, the storage line 156 and the initialization voltage line 159 may include a same material as each other, and may be disposed in a same layer as each other.

The storage line 156 and the initialization voltage line 159 may extend in the second direction W2 on a plane. The storage line 156 may be disposed between the first scan line 151 and the control line 153 on a plane, and may include an expansion portion 157 that is disposed on the respective pixels R, G, and B. The expansion portion 157 may receive the driving voltage ELVDD by being connected to the driving voltage line 172 through a contact hole 68. A storage opening 51 is defined in the expansion portion 157.

The initialization voltage line 159 transmits an initialization voltage Vint, and may be disposed between the third scan line 154 and the control line 153 on a plane, but the location of the initialization voltage line 159 is not limited thereto.

In an exemplary embodiment, the display device may further include a third conductive layer that includes the data lines 171 that transmit the data signal Dm and the driving voltage line 172 that transmits the driving voltage ELVDD. The third conductive layer is disposed in a layer different from the layers where the first conductive layer and the second conductive layers are disposed on a cross-section. In one exemplary embodiment, for example, the third conductive layer may be disposed on the second conductive layer on a cross-section. In such an embodiment, the data lines 171 and the driving voltage line 172 may be disposed in a same layer as each other, and may include a same material as each other.

The data line 171 and the driving voltage line 172 may extend in the first direction W1 on a plane, and may cross the plurality of scan lines 151, 152 and 154, the control line 153, the initialization voltage line 159, and the storage line 156.

Each of the pixels R, G, and B may include the plurality of transistors T1, T2, T3, T4, T5, T6 and T7 that are connected to the scan lines 151, 152 and 154, the control line 153, data line 171 and the driving voltage line 172, a capacitor Cst, and a light emitting diode ED.

A channel of each of the plurality of transistors T1, T2, T3, T4, T5, T6 and T7 included in each of the pixels R, G and B may be defined or formed in a single active pattern 130, and the active pattern 130 may be curved with various shapes. The active pattern 130 may include a semiconductor material, such as a polysilicon, an oxide semiconductor and the like.

The active pattern 130 may be disposed between the substrate 110 and the first conductive layer on a cross-section.

The active pattern 130 includes channel regions 131a, 131b, 131c_1, 131c_2, 131d_1, 131d_2, 131e, 131f and 131g that respectively define the channels of the respective transistors T1, T2, T3, T4, T5, T6 and T7, and a conductive region. In an exemplary embodiment, the third transistor T3 and the fourth transistor T4 may have a dual-gate structure. In such an embodiment, the third transistor T3 may include two channel regions 131c_1 and 131c_2, and the fourth transistor T4 may also include two channel regions 131d_1 and 131d_2.

The conductive region of the active pattern 130 is disposed at opposite ends of each of the channel regions 131a, 131b, 131c_1, 131c_2, 131d_1, 131d_2, 131e, 131f and 131g, and has a higher carrier concentration than those of the channel regions 131a, 131b, 131c_1, 131c_2, 131d_1, 131d_2, 131e, 131f and 131g. Other portions in the active pattern 130, excluding the channel regions 131a, 131b, 131c_1, 131c_2, 131d_1, 131d_2, 131e, 131f, 131g, may be mostly conductive regions. A pair of conductive regions that are disposed at the opposite ends of the channel regions 131a, 131b, 131c_1, 131c_2, 131d_1, 131d_2, 131e, 131f and 131g of the respective transistors T1, T2, T3, T4, T5, T6 and T7 are a source region and a drain region of the corresponding transistor, and may serve as a source electrode and a drain electrode, respectively.

The first transistor T1 includes the channel region 131a, a source region 136a, a drain region 137a and a driving gate electrode 155a. The source region 136a and the drain region 137a are the conductive regions of the active pattern 130, respectively disposed at opposite ends of the channel region 131a, and the driving gate electrode 155a overlaps the channel region 131a on a plane.

The channel region 131a of the first transistor T1 may be bent at least once. In one exemplary embodiment, for example, the channel region 131a may have a meandering shape or a zigzag shape.

The source region 136a and the drain region 137a are connected to the opposite ends of the channel region 131a on a plane.

The driving gate electrode 155a may be included in the first conductive layer, and may be connected to a connection member 174 through a contact hole 61 and the storage opening 51. The storage opening 51 surrounds the contact hole 61. The connection member 174 may be included in the third conductive layer on a cross-section. The connection member 174 may extend in parallel with a direction in which the data line 171 substantially extends. The connection member 174 corresponds to the driving gate node GN (shown in FIG. 4) and the driving gate electrode 155a.

The second transistor T2 includes the channel region 131b, a source region 136b, a drain region 137b, and a gate electrode 155b. The source region 136b and the drain region 137b are conductive regions of the active pattern 130, disposed at opposite sides of the channel region 131b, and the gate electrode 155b overlaps the channel region 131b on a plane. The gate electrode 155b is defined by a part of the first scan line 151. The source region 136b is disposed on an upper side on a plane with reference to the first scan line 151 and is connected to the channel region 131b, and is connected to the data line 171 through a contact hole 62. The drain region 137b is disposed on a lower side on a plane with reference to the first scan line 151 and is connected to the channel region 131b, and is connected to the source region 136a of the first transistor T1.

The third transistor T3 may include two portions for preventing a current leakage. in an exemplary embodiment, the third transistor T3 may include an upper third transistor T3_1 and a lower third transistor T3_2 that are connected to each other while being adjacent to each other.

The upper third transistor T3_1 includes the channel region 131c_1 that overlaps the first scan line 151 on a plane, a source region 136c_1, a drain region 137c_1, and a gate electrode 155c_1. The channel region 131c_1 and the drain region 137c_1 are conductive regions of the active pattern 130, disposed at opposite sides of the channel region 131c_1, and the gate electrode 155c_1 overlaps the channel region 131c_1. The gate electrode 155c_1 may be a part of a protrusion of the first scan line 151. The drain region 137c_1 is disposed on an upper side on a plane with reference to the first scan line 151, and is connected to the connection member 174 through a contact hole 63.

The lower third transistor T3_2 includes the channel region 131c_2, a source region 136c_2, a drain region 137c_2, and a gate electrode 155c_2. The channel region 131c_2 overlaps the first scan line 151 on a plane, the source region 136c_2 and the drain region 137c_2 are conductive regions of the active pattern 130, disposed at opposite sides of the channel region 131c_2, and the gate electrode 155c_2 overlaps the channel region 131c_2. The gate electrode 155c_2 is defined by a part of the first scan line 151. The source region 136c_2 of the lower third transistor T3_2 is connected to the drain region 137a of the first transistor T1, and the drain region 137c_2 is connected to the source region 136c_1 of the upper third transistor T3_1.

The fourth transistor T4 may include two portions for preventing a current leakage. In an exemplary embodiment, the fourth transistor T4 may include a left fourth transistor T4_1 and a right fourth transistor T4_2 that are connected to each other while being adjacent to each other.

The left fourth transistor T4_1 includes the channel region 131d_1 that overlaps the second scan line 152 on a plane, a source region 136d_1, a drain region 137d_1, and a gate electrode 155d_1. The source region 136d_1 and the drain region 137d_1 are conductive regions of the active pattern 130, disposed at opposite sides of the channel region 131d_1, and the gate electrode 155d_1 overlaps the channel region 131d_1. The gate electrode 155d_1 is defined by a part of the second scan line 152. The drain region 137d_1 is disposed on a lower side with reference to the second scan line 152 on a plane and connected to the drain region 137c_1 of the upper third transistor T3_1, and is connected to the connection member 174 through the contact hole 63.

The right fourth transistor T4_2 includes the channel region 131d_2 that overlaps the second scan line 152 on a plane, a source region 136d_2, a drain region 137d_2, and a gate electrode 155d_2. The source region 136d_2 and the drain region 137d_2 are conductive regions of the active pattern 130, disposed at opposite sides of the channel region 131d_2, and the gate electrode 155d_2 overlaps the channel region 131d_2. The gate electrode 155d_2 is defined by a part of the second scan line 152. The drain region 137d_2 is connected to the source region 136d_1 of the left fourth transistor T4_1, and the source region 136d_2 is connected to a connection member 175 through a contact hole 65.

The connection member 175 may be included in the third conductive layer on a cross-section. The connection member 175 may be electrically connected to the initialization voltage line 159 through a contact hole 64.

The fifth transistor T5 includes the channel region 131e, a source region 136e, a drain region 137e, and a gate electrode 155e. The source region 136e and the drain region 137e are conductive regions of the active pattern 130, disposed at opposite side of the channel region 131e, and the gate electrode 155e overlaps the channel region 131e. The gate electrode 155e is defined by a part of the control line 153. The source region 136e is disposed on a lower side with reference to the control line 153 on a plane and connected to the channel region 131e, and is connected to the driving voltage line 172 through a contact hole 67. The drain region 137e is disposed on an upper side with reference to the control line 153 on a plane and connected to the channel region 131e, and is connected to the source region 136a of the first transistor T1.

The sixth transistor T6 includes the channel region 131f, a source region 136f, a drain region 137f, and a gate electrode 155f. The source region 136f and the drain region 137f are conductive regions of the active pattern 130, disposed at opposite sides of the channel region 131f, and the gate electrode 155f overlaps the channel region 131f. The gate electrode 155f is defined by a part of the control line 153. The source region 136f is disposed on an upper side with reference to the control line 153 on a plane and connected to the channel region 131f, and is connected to the drain region 137a of the first transistor T1. The drain region 137f is disposed on a lower side with reference to the control line 153 on a plane and connected to the channel region 131f, and is connected to a connection member 179 through a contact hole 69. The connection member 179 may be included in the third conductive layer on a cross-section.

The seventh transistor T7 includes the channel region 131g, a source region 136g, a drain region 137g, and a gate electrode 155g. The source region 136g and the drain region 137g are conductive regions of the active pattern 130, disposed at opposite sides of the channel region 131g, and the gate electrode 155g overlaps the channel region 131g. The gate electrode 155g is defined by a part of the third scan line 154. The source region 136g is disposed on an upper side with reference to the third scan line 154 on a plane and connected to the channel region 131g, and is connected to the drain region 137f of the sixth transistor T6. The drain region 137g is disposed on a lower side with reference to the third scan line 154 on a plane, and is connected to the connection member 175 through the contact hole 65 to receive the initialization voltage Vint.

In an exemplary embodiment, the capacitor Cst may include the driving gate electrode 155a and the expansion portion 157 of the storage line 156 overlapping each other on a plane as two terminals thereof. The capacitor Cst may maintain a voltage difference that corresponds to a difference between the expansion portion 157 of the storage line 156, which receives the driving voltage ELVDD, and a voltage of the driving gate electrode 155a. The expansion portion 157 of the storage line 156 may have a wider area on a plane than the driving gate electrode 155a, and thus may cover the entire area of the corresponding driving gate electrode 155a.

In an exemplary embodiment, the second conductive layer may further include a shield pattern 158 that overlaps the data line 171. The shield pattern 158 is connected to the driving voltage line 172 through a contact hole 66 and thus receives the driving voltage ELVDD. The shield pattern 158 shields between the driving gate node GN and the data line 171 to prevent a change in a voltage of the driving gate node GN due to a change in the data signal Dm. In an alternative exemplary embodiment, the shield pattern 158 may be omitted.

In an exemplary embodiment, the display device may further include a fourth conductive layer including a data voltage transmission line 510 that transmits the data signal Dm. In such an embodiment, as shown in FIG. 8, the fourth conductive layer is disposed in a layer that is different from the layer in which the first, second and third conductive layers are disposed, on a cross-section. In one exemplary embodiment, for example, the fourth conductive layer may be disposed on the third conductive layer on a cross-section. In an alternative exemplary embodiment, the fourth conductive layer may be disposed on a same layer as the third conductive layer and may include a same material as that of the third conductive layer.

At least a part of the data voltage transmission line 510 disposed at the first side portion (115 of FIG. 3) and an edge portion (112 of FIG. 3) of the substrate 110 may extend substantially in the second direction W2 on a plane.

An end of the data voltage transmission line 510 may overlap the data line 171. The data voltage transmission line 510 is connected to the data line 171 through a contact hole 610, and may transmit the data signal Dm to the data line 171. The data voltage transmission line 510 is disposed in a different layer from the data line 171.

The data line 171 disposed in the first side portion 115 (refer to FIG. 3) and the edge portion 112 (refer to FIG. 3) of the substrate 110 is not directly connected to the driving circuit portion 400 (refer to FIG. 3).

The data voltage transmission line 510 connects the data line 171 disposed in the first side portion 115 (refer to FIG. 3) and the edge portion 112 (refer to FIG. 3) of the substrate 110 and the driving circuit portion 400 (refer to FIG. 3) such that the data signal Dm may be transmitted from the driving circuit portion 400 to the data line 171.

In an exemplary embodiment, the display device may further include a fifth conductive layer that includes a plurality of pixel electrodes 191a, 191b and 191c, and a pixel conductive pattern 192. The fifth conductive layer is disposed in a layer that is different from the first, second, third, and fourth conductive layers on a cross-section. In one exemplary embodiment, for example, the fifth conductive layer may be disposed on the fourth conductive layer on a cross-section, or may be disposed on the same layer as the fourth conductive layer and may include the same material as that of the fourth conductive layer.

In an exemplary embodiment, the plurality of pixel electrodes 191a, 191b and 191c may be arranged in a pentile matrix format. In one exemplary embodiment, for example, the pixel electrode 191a of the red pixel R and the pixel electrode 191c of the blue pixel B may be alternately arranged in a horizontal direction, the pixel electrode 191a of the red pixel R and the pixel electrode 191b of the green pixel G may be alternately arranged in one diagonal direction, and the pixel electrode 191c of the blue pixel B and the pixel electrode 191b of the green pixel G may be alternately arranged in another diagonal direction. However, the arrangement of the pixel electrodes 191a, 191b and 191c is not limited thereto, and may be variously modified.

Each of the pixel electrodes 191a, 191b, and 191c may be connected to the connection member 179 through a contact hole 89 and thus receives a voltage.

The pixel conductive pattern 192 may be bent along edges of adjacent pixel electrodes 191a, 191b and 191c, and may include straight line portions (e.g., horizontal or vertical portion) 192a, 192b and 192c, and an oblique line portion 193. The straight line portions 192a, 192b and 192c may extend substantially in parallel with the scan lines 151, 152 and 154, and the oblique line portion 193 may extend obliquely with respect to the extension direction of the straight line portions 192a, 192b and 192c. The straight line portion 192a may be adjacent to an upper side of the pixel electrode 191a of the red pixel R, the straight line portion 192b may be adjacent to an upper side of the pixel electrode 191b of the green pixel G, and the straight line portion 192c may be adjacent to an upper side of the pixel electrode 191c of the blue pixel B.

The pixel conductive pattern 192 may transmit the initialization voltage Vint.

Hereinafter, a cross-sectional structure of an exemplary embodiment of the display device will be described in detail.

In an exemplary embodiment, as shown in FIG. 8, a buffer layer 120 may be disposed on the substrate 110. The buffer layer 120 effectively prevents an impurity from permeating into an upper layer of the buffer layer 120, particularly, to the active pattern 130 from the substrate 110, to thereby improve a characteristic of the active pattern 130 and release a stress. The buffer layer 120 may include an inorganic insulation material such as a silicon nitride (SiNx), a silicon oxide (SiOx) and the like, and/or an organic insulation material. At least a part of the buffer layer 120 may be omitted.

As described above, the active pattern 130 is disposed on the buffer layer 120, and a first insulation layer 141 is disposed on the active pattern 130.

As described above, the first conductive layer may be disposed on the first insulation layer 141. The first conductive layer may include a metal, such as copper (Cu), aluminum (Al), molybdenum (Mo), or an alloy thereof.

A second insulation layer 142 may be disposed on the first conductive layer and the first insulation layer 141.

As described above, the second conductive layer may be disposed on the second insulation layer 142. The second conductive layer may include a metal such as copper (Cu), aluminum (Al), molybdenum (Mo), or an alloy thereof.

A third insulation layer 160 may be disposed on the second conductive layer and the second insulation layer 142.

At least one of the first insulation layer 141, the second insulation layer 142, and the third insulation layer 160 may include an inorganic insulation material such as a silicon nitride (SiNx), a silicon oxide (SiOx), and the like, and/or an organic insulation material.

The contact hole 61 disposed on the driving gate electrode 155a, the contact hole 62 disposed on the source region 136b of the second transistor T2, the contact hole 63 disposed on the drain region 137c_1 of the upper third transistor T3_1 or the drain region 137d_1 of the left fourth transistor T4_1, the contact hole 64 disposed on the initialization voltage line 159, the contact hole 65 disposed on the source region 136d_2 of the right fourth transistor T4_2 or the drain region 137g of the seventh transistor T7, the contact hole 66 disposed on the shield pattern 158, the contact hole 67 disposed on the source region 136e of the fifth transistor T5, the contact hole 68 disposed on the expansion portion 157 of the storage line 156, and the contact hole 69 disposed on the drain region 137f of the sixth transistor T6 may be formed in the first insulation layer 141, the second insulation layer 142, and the third insulation layer 160.

As described above, the third conductive layer may be disposed on the third insulation layer 160. The third conductive layer may include a metal such as copper (Cu), aluminum (Al), molybdenum (Mo), an alloy thereof, and the like.

The expansion portion 157 of the storage line 156 may form the capacitor Cst by overlapping the driving gate electrode 155a, interposing the second insulation layer 142 therebetween.

A fourth insulation layer 162 may be disposed on the third conductive layer and the third insulation layer 160.

The fourth insulation layer 162 may include an inorganic insulation material such as a silicon nitride (SiNx), a silicon oxide (SiOx), and the like, and/or an organic insulation material.

The contact hole 610 that is disposed on the data line 171 may be formed in the fourth insulation layer 162.

As described above, the fourth conductive layer may be disposed on the fourth insulation layer 162. The fourth conductive layer may include a metal, such as copper (Cu), aluminum (Al), molybdenum (Mo), an alloy thereof and the like.

A passivation layer 180 is disposed on the fourth conductive layer and the fourth insulation layer 162. The passivation layer 180 may include an organic insulation material, such as a polyacrylic resin, a polyimide resin and the like, and a top surface of the passivation layer 180 may be substantially flat. The contact hole 89 is defined through a portion of the passivation layer 180 to overlap the connection member 179.

As described above, the fifth conductive layer may be disposed on the passivation layer 180.

A pixel defining layer 350 may be disposed on the passivation layer 180 and the fifth conductive layer. An opening 351 is defined through the pixel defining layer 350 to overlap the pixel electrodes 191a, 191b and 191c.

An emission layer 370 is disposed on the pixel electrodes 191a, 191b and 191c. The emission layer 370 may be disposed in the opening 351. The emission layer 370 may include an organic light emission material or an inorganic light emission material.

A common electrode 270 is disposed on the emission layer 370. The common electrode 270 may also be disposed on the pixel defining layer 350 and thus may extend over the plurality of pixels.

The pixel electrodes 191a, 191b and 191c, the emission layer 370, and the common electrode 270 collectively define a light emitting diode ED.

An encapsulation layer (not shown) that protects the light emitting diode ED may further be disposed on the common electrode 270. The encapsulation layer may include an inorganic layer and an organic layer that are alternately stacked on one another.

Hereinafter, a structure of a part of another portion of an exemplary embodiment of the display device will be described with reference to FIG. 9 and FIG. 10, together with FIG. 4 and FIG. 5.

Figure 9:
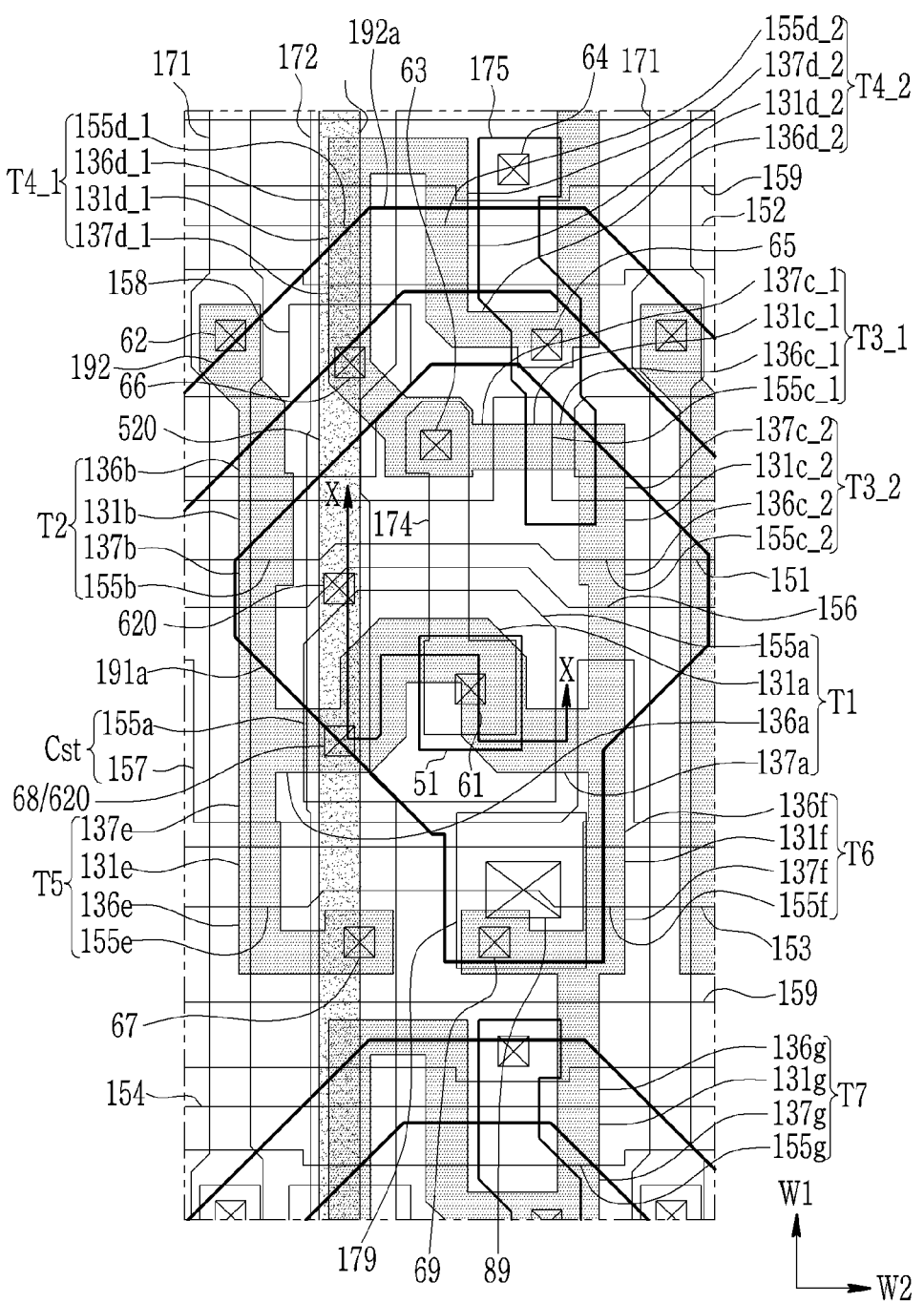
FIG. 9 is a top plan view of a pixel of a display device according to an exemplary embodiment.
Figure 10:
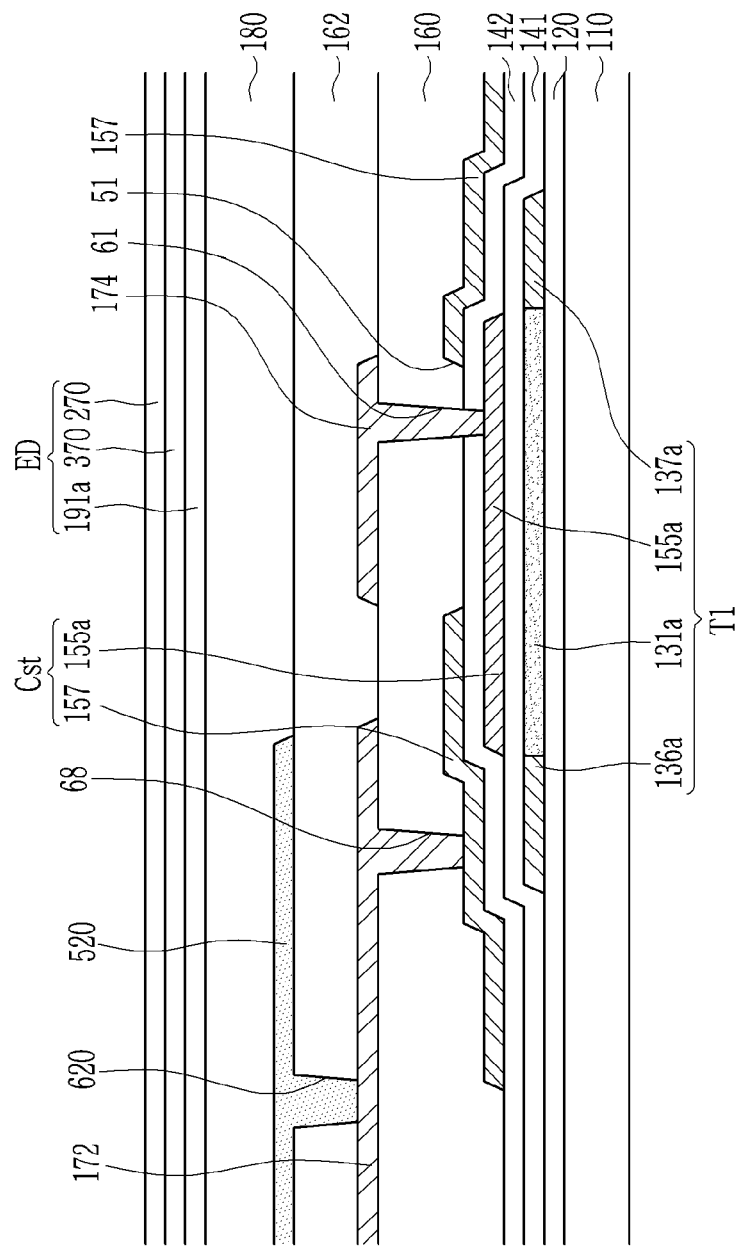
FIG. 10 is a cross-sectional view taken along line X-X of FIG. 9.

FIG. 9 is a top plan view of a pixel of the display device according to an exemplary embodiment, and FIG. 10 is a cross-sectional view taken along line X-X of FIG. 9. FIG. 9 and FIG. 10 show a pixel disposed on the main display portion 111 (refer to FIG. 3) of the substrate 110.

In an exemplary embodiment, the display device includes the plurality of signal lines 151, 152, 153, 154, 171 and 172, and the transistors T1, T2, T3, T4, T5, T6 and T7.

In an exemplary embodiment, the display device may further include the driving voltage transmission line 520 that transmits the driving voltage ELVDD. The driving voltage transmission line 520 may be disposed on the main display portion 111 (refer to FIG. 3) of the substrate 110. The driving voltage transmission line 520 may be disposed in the fourth conductive layer. The driving voltage transmission line 520 may be disposed on the same layer as the data voltage transmission line 510.

The driving voltage transmission line 520 may extend in the first direction W1 on a plane. The driving voltage transmission line 520 may extend in parallel with the driving voltage line 172.

The driving voltage transmission line 520 may overlap the driving voltage line 172. The driving voltage transmission line 520 is disposed in a layer that is different from a layer in which the driving voltage line 172 is disposed. The driving voltage transmission line 520 may be disposed on the fourth insulation layer 162. A contact hole 620, which overlaps the driving voltage line 172, may be defined in the fourth insulation layer 162. The driving voltage transmission line 520 may be connected to the driving voltage line 172 through the contact hole 620, and thus transmits the driving voltage ELVDD. The driving voltage transmission line 520 is connected to the driving voltage line 172 and thus resistance of the driving voltage line 172 may be reduced.

Next, an alternative exemplary embodiment of a display device will be described with reference to FIG. 11 and FIG. 12.

Figure 11:
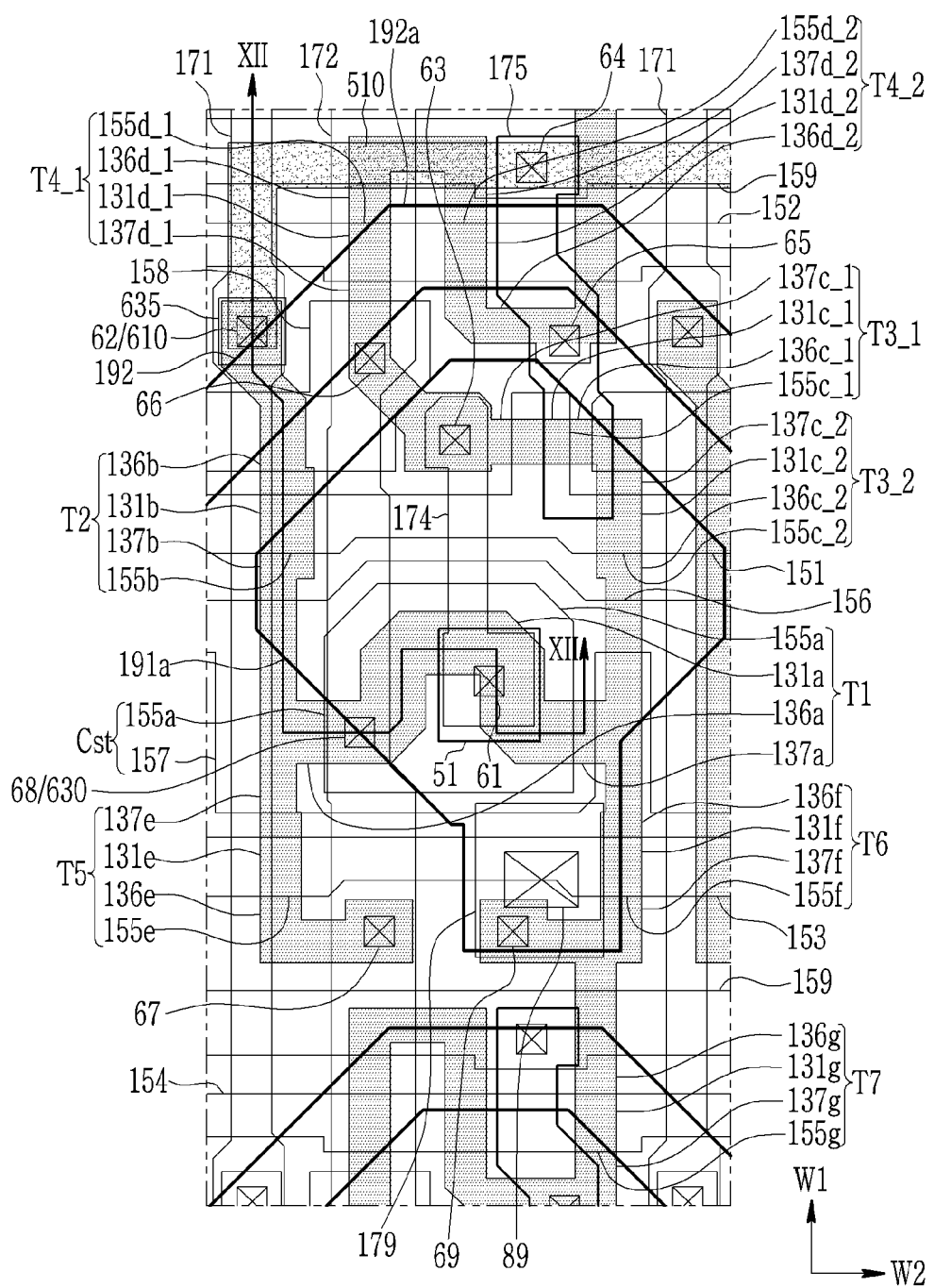
FIG. 11 is a top plan view of a pixel of a display device according to an alternative exemplary embodiment.
Figure 12:
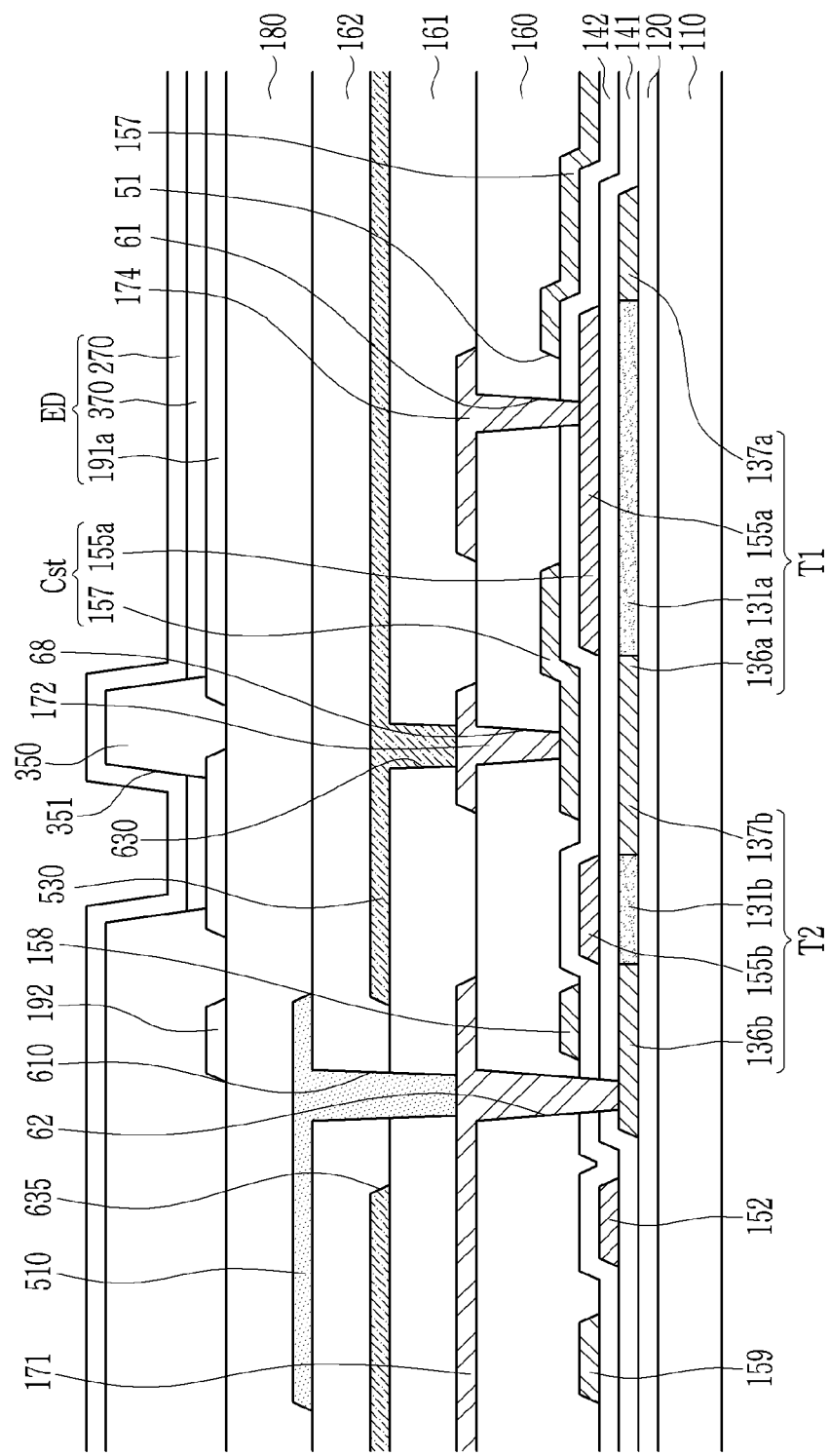
FIG. 12 is a cross-sectional view taken along line XII-XII of FIG. 11.

FIG. 11 is a top plan view of a pixel of the display device according to an alternative exemplary embodiment, and FIG. 12 is a cross-sectional view taken along line XII-XII of FIG. 11.

A display device shown in FIG. 11 and FIG. 12 is substantially the same as the display device of FIG. 1 to FIG. 10 except that the display device further includes a shield layer. The same or like elements shown in FIG. 11 and FIG. 12 have been labeled with the same reference characters as used above to describe the exemplary embodiments of the display device shown in FIG. 1 to FIG. 10, and any repetitive detailed description thereof will hereinafter be omitted or simplified.

In an exemplary embodiment, as shown in FIG. 11, the display device includes a plurality of signal lines 151, 152, 153, 154, 171 and 172, and transistors T1, T2, T3, T4, T5, T6 and T7 that are disposed on a substrate 110. In such an embodiment, the display device further includes a data voltage transmission line 510 that is connected to a data line 171 disposed in a first side portion 115 and an edge portion 112 of the substrate 110.

In an exemplary embodiment, as shown in FIG. 12, the display device further includes a shield layer 530 that is disposed on the substrate 110. The shield layer 530 may cover most of an upper surface of the substrate 110.

The shield layer 530 is disposed between the data line 171 and the data voltage transmission line 510, and may be disposed between the first transistor T1 and the data voltage transmission line 510. A driving voltage line 172 is disposed between the substrate 110 and the shield layer 530. The shield layer 530 is connected to the driving voltage line 172.

A fifth insulation layer 161 is disposed between the driving voltage line 172 and the shield layer 530. The fifth insulation layer 161 may include an inorganic insulation material, such as a silicon nitride (SiNx), a silicon oxide (SiOx) and the like, and/or an organic insulation material.

The shield layer 530 may overlap the driving voltage line 172. The shield layer 530 is disposed on a different layer from the driving voltage line 172. The shield layer 530 may be disposed on the fifth insulation layer 161, and the driving voltage line 172 may be disposed below the fifth insulation layer 161. A contact hole 630, which overlaps the driving voltage line 172, may be defined in the fifth insulation layer 161. The shield layer 530 may be connected to the driving voltage line 172 through the contact hole 630. A driving voltage ELVDD is applied to the shield layer 530. The shield layer 530 blocks coupling between a driving gate node GN and the data voltage transmission line 510 such that a voltage of the driving gate node GN may be effectively prevented from being affected by a change in a data signal Dm. In such an embodiment, the shield layer 530 blocks coupling between the data line 171 and the data voltage transmission line 510 such that the data line 171 and the data voltage transmission line 510 that respectively receive different data signals Dm may be prevented from being affected by each other.

An opening 635 is defined in the shield layer 530. The opening 635 surrounds the contact hole 610 defined in the fourth insulation layer 162. The data voltage transmission line 510 is disposed in the contact hole 610. The shield layer 530 and the data voltage transmission line 510 may be effectively prevented from being short-circuited by the opening 635 in the shield layer 530. In an exemplary embodiment, the size of the opening 635 is greater than the size of the contact hole 610.

Next, another alternative exemplary embodiment of a display device according will be described with reference to FIG. 13 to FIG. 16.

Figure 13:
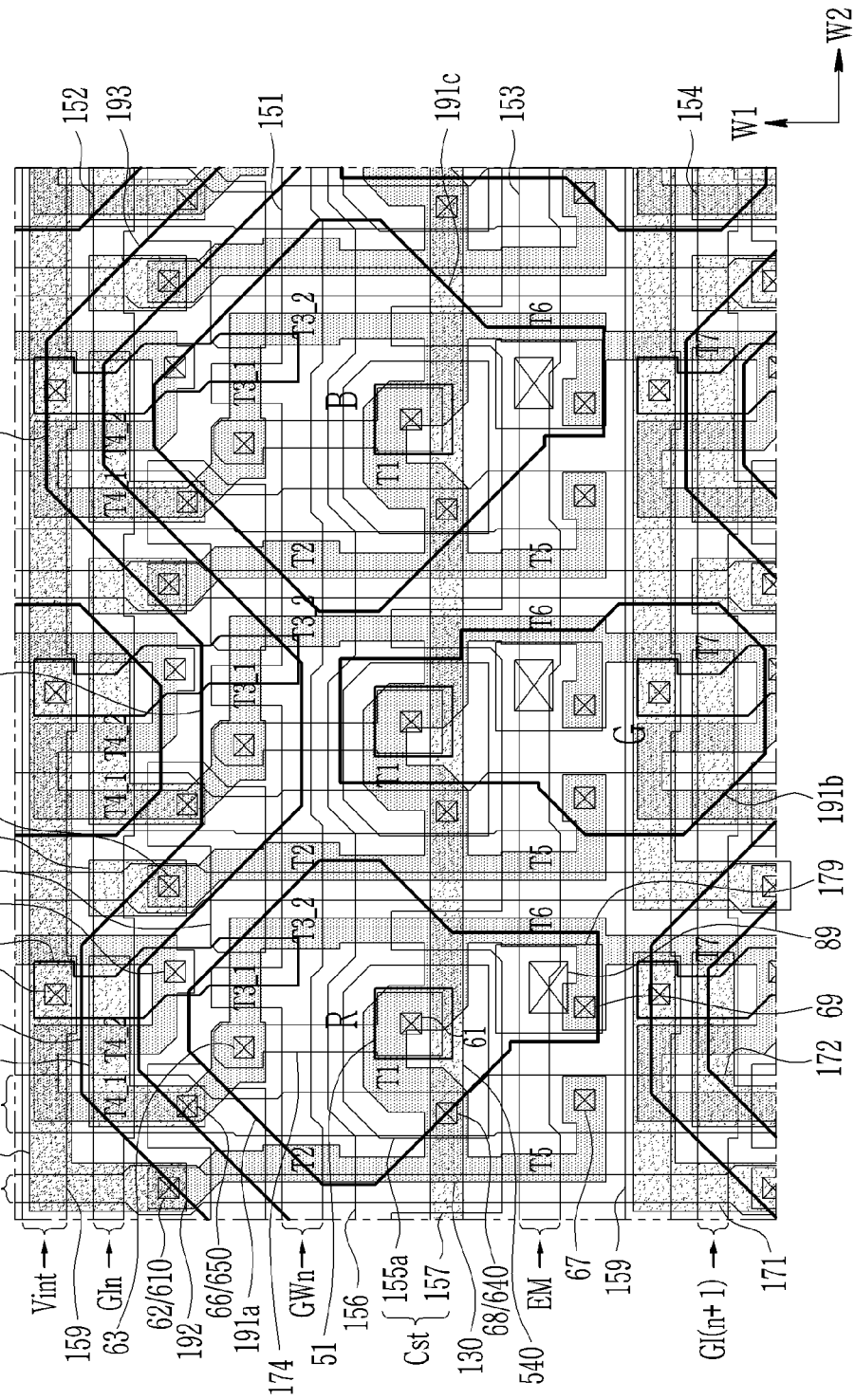
FIG. 13 is a top plan view of a plurality of pixels that neighbor each other of the display device according to another alternative exemplary embodiment.
Figure 14:
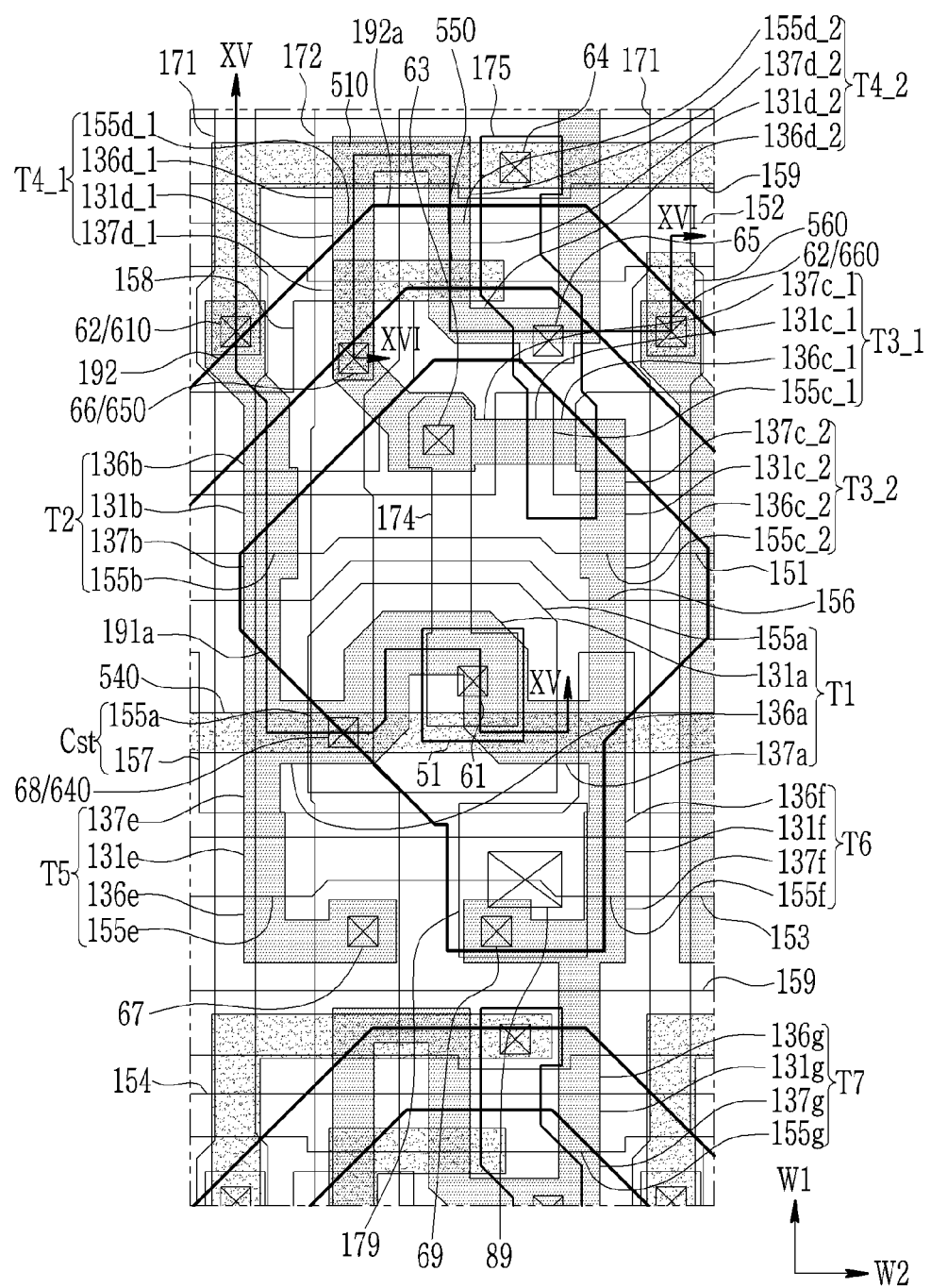
FIG. 14 is a top plan view of one of the pixels of FIG. 13.
Figure 15:
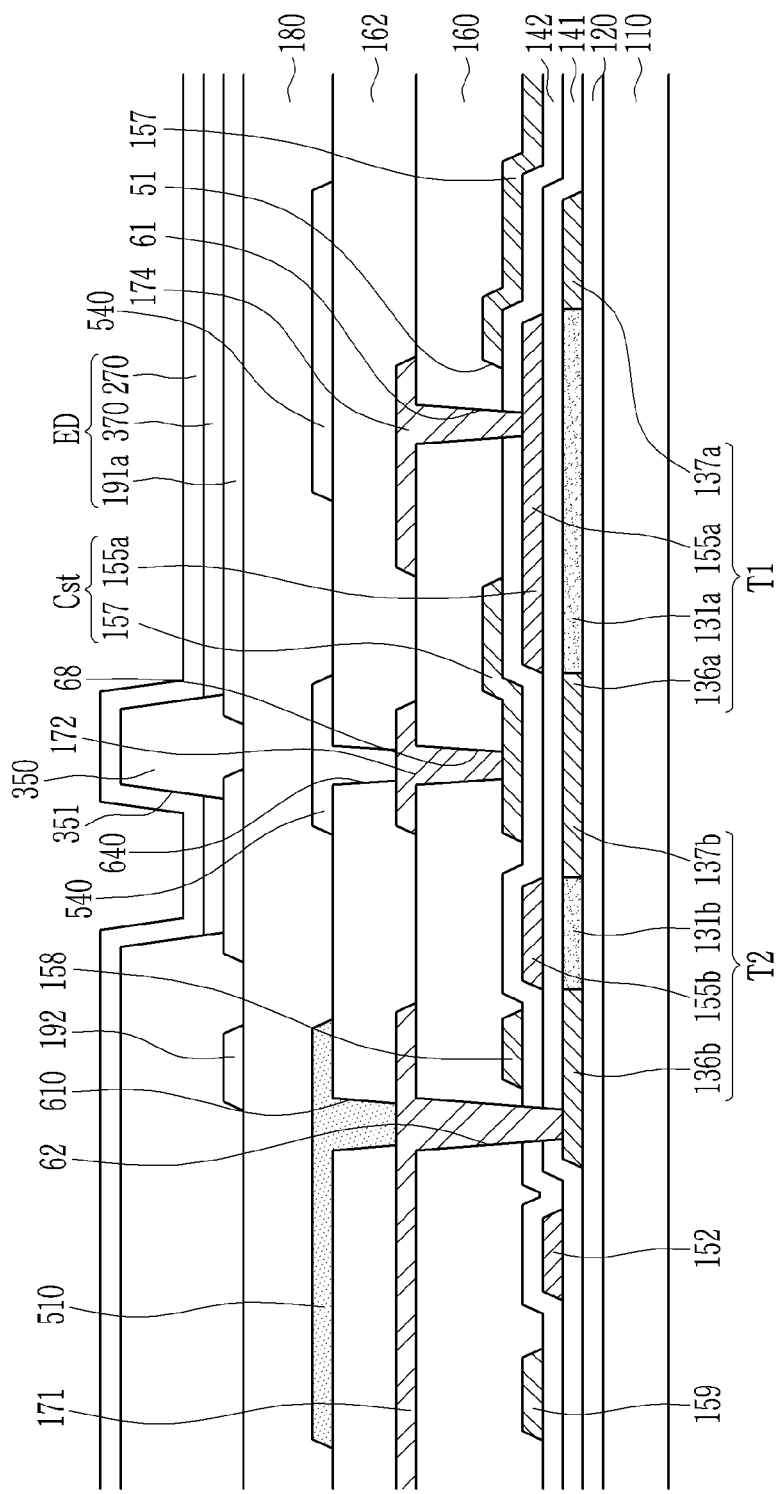
FIG. 15 is a cross-sectional view taken along line XV-XV of FIG. 14.

FIG. 13 is a top plan view of a plurality of pixels that are adjacent to each other of the display device according to another alternative exemplary embodiment, and FIG. 14 shows one of the plurality of pixels of FIG. 13. FIG. 15 is a cross-sectional view taken along line XV-XV of FIG. 14, and FIG. 16 is a cross-sectional view taken along line XVI-XVI of FIG. 14.

A display device shown in FIG. 13 to FIG. 16 is substantially the same as the display device of FIG. 1 to FIG. 10, except that a shield pattern, a dummy pattern and the like. The same or like elements shown in FIG. 13 to FIG. 16 have been labeled with the same reference characters as used above to describe the exemplary embodiments of the display device shown in FIG. 1 to FIG. 10, and any repetitive detailed description thereof will hereinafter be omitted or simplified.

In an exemplary embodiment, as shown in FIG. 13, the display device includes a plurality of signal lines 151, 152, 153, 154, 171 and 172, and a plurality of transistors T1, T2, T3, T4, T5, T6 and T7 that are disposed on a substrate 110. In such an embodiment, the display device further includes a data voltage transmission line 510 that is connected to a data line 171 disposed in a first side portion 115 (refer to FIG. 3) and an edge portion 112 (refer to FIG. 3) of the substrate 110.

Figure 16:
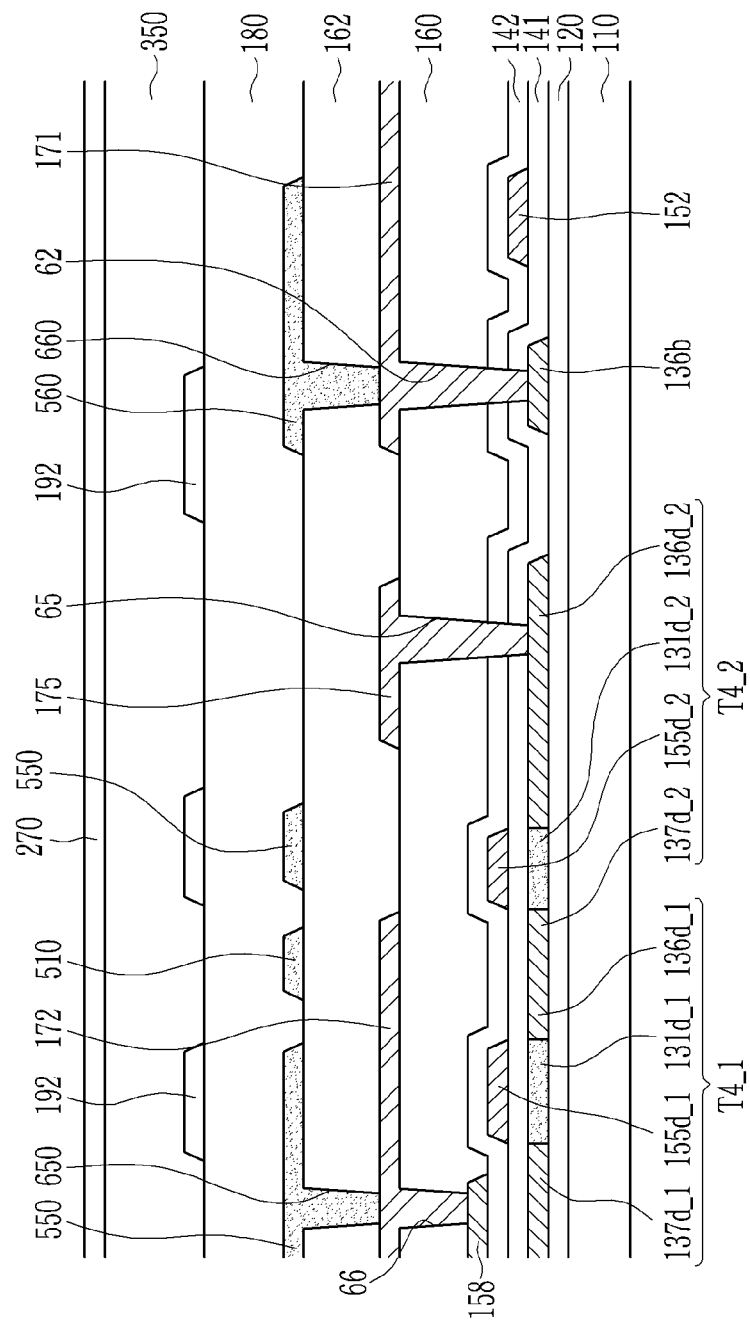
FIG. 16 is a cross-sectional view taken along line XVI-XVI of FIG. 14.

In an exemplary embodiment, as shown in FIG. 14 and FIG. 16, the display device further includes a driving voltage transmission line 540, a shield pattern 550 and a dummy pattern 560, which are disposed on the substrate 110. The driving voltage transmission line 540, the shield pattern 550 and the dummy pattern 560 may be disposed on the fourth conductive layer. The driving voltage transmission line 540, the shield pattern 550 and the dummy pattern 560 may be disposed on a same layer as the data voltage transmission line 510.

The driving voltage transmission line 540 may extend substantially in a second direction W2 on a plane. The driving voltage transmission line 540 may extend in parallel with the data voltage transmission line 510. The driving voltage transmission line 540 may cross the driving voltage line 172.

The driving voltage transmission line 540 may overlap the driving voltage line 172. The driving voltage transmission line 540 may be disposed on a different layer from the driving voltage line 172. The driving voltage transmission line 540 may be disposed on the fourth insulation layer 162. A contact hole 640, which overlaps the driving voltage line 172, may be defined in the fourth insulation layer 162. The driving voltage transmission line 540 may be connected to the driving voltage line 172 through the contact hole 640, and thus transmits a driving voltage ELVDD. The driving voltage transmission line 540 crosses a plurality of driving voltage lines 172, and connects the plurality of driving voltage lines 172 to each other. The driving voltage transmission line 540 may reduce resistance of the driving voltage line 172, and a substantially constant driving voltage ELVDD may be applied to the plurality of driving voltage lines 172.

The shield pattern 550 is disposed to be adjacent to the data voltage transmission line 510. The shield pattern 550 may be disposed between the data voltage transmission line 510 and the first transistor T1.

The shield pattern 550 may overlap the driving voltage lines 172. The shield pattern 550 is disposed on a different layer from the driving voltage line 172. The shield pattern 550 may be disposed on the fourth insulation layer 162. A contact hole 650, which overlaps the driving voltage line 172, may be defined in the fourth insulation layer 162. The shield pattern 550 may be connected to the driving voltage line 172 through the contact hole 650. The driving voltage ELVDD is applied to the shield pattern 550. The shield pattern 550 blocks coupling between a driving gate node GN and the data voltage transmission line 510 such that a voltage of the driving gate node GN can be prevented from being affected by a change in the data signal Dm.

The dummy pattern 560 may overlap the data line 171. The dummy pattern 560 is disposed on a different layer from the data line 171. The dummy pattern 560 may be disposed on the fourth insulation layer 162. A contact hole 660, which overlaps the data line 171, may be defined in the fourth insulation layer 162. The dummy pattern 560 may be connected to the data line 171 through the contact hole 660.

As described herein, when the data voltage transmission line 510 is disposed in some pixels but not in some other pixels, a parasitic capacitance difference may occur between the pixels. In exemplary embodiments of the invention, since the dummy pattern 560 is disposed in the pixels where the data voltage transmission line 510 is not disposed, parasitic capacitances between pixels become substantially the same as each other.

While the invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
a substrate including:
a first display portion;
a second display portion extended from the first display portion; and
an edge portion disposed between the first display portion and the second display portion;
scan lines disposed on the substrate;
data lines disposed on the substrate;
transistors connected to the scan lines and the data lines; and
a data voltage transmission line connected to a data line disposed in the second display portion,
wherein the data line and the data voltage transmission line are disposed in different layers from each other,
wherein the edge portion includes a rounded corner, and the data voltage transmission line extends along a rounded edge of the rounded corner at the edge portion.

2. The display device of claim 1, wherein the second display portion is bent from the first display portion.

3. The display device of claim 1, further comprising:
an insulation layer disposed between the data line and the data voltage transmission line,
wherein a contact hole is defined in the insulation layer, and
wherein the data voltage transmission line is connected to the data line through the contact hole.

4. The display device of claim 1, wherein
the data lines extend in a first direction,
the data voltage transmission line extends in a second direction in the second display portion, and
the data voltage transmission line has a portion extending along the edge portion.

5. The display device of claim 1, wherein the second display portion is extended from the edge portion.

6. The display device of claim 5, wherein the second display portion is bent from the edge portion.

7. The display device of claim 1, wherein the data voltage transmission line comprises a first portion and a second portion which is disposed on a different layer from the first portion.

8. The display device of claim 7, further comprising:
an insulation layer disposed between the first portion and the second portion.

9. The display device of claim 1, further comprising:
driving voltage lines disposed on the substrate; and
a driving voltage transmission line connected to the driving voltage lines,
wherein the data voltage transmission line and the driving voltage transmission line are disposed in a same layer as each other.

10. The display device of claim 9, wherein the driving voltage transmission line extends in a direction parallel with the driving voltage lines.

11. The display device of claim 10, wherein the driving voltage transmission line overlaps the driving voltage lines.

12. The display device of claim 11, further comprising:
an insulation layer disposed between the driving voltage transmission line and the driving voltage line,
wherein a contact hole is defined in the insulation layer, and
wherein the driving voltage transmission line is connected to the driving voltage line through the contact hole.

13. The display device of claim 1, further comprising:
a dummy pattern which overlaps the data lines and is connected to the data lines.

14. The display device of claim 1, further comprising:
a driving circuit portion connected to a second side portion,
wherein the data voltage transmission line is connected between the driving circuit portion and the data line.

15. A display device comprising:
a substrate including:
a first display portion; and
a second display portion extended from the first display portion;
scan lines disposed on the substrate;
data lines disposed on the substrate;
transistors connected to the scan lines and the data lines; and
a data voltage transmission line connected to a data line disposed in the second display portion;
a shield layer disposed between the transistor and the data voltage transmission line; and
a driving voltage line disposed between the substrate and the shield layer,
wherein the data line and the data voltage transmission line are disposed in different layers from each other, and
wherein the shield layer is connected to the driving voltage line.

16. The display device of claim 15, further comprising:
a first insulation layer disposed between the driving voltage line and the shield layer,
wherein a first contact hole is defined in the first insulation layer,
wherein the shield layer is connected to the driving voltage line through the first contact hole.

17. The display device of claim 16, further comprising:
a second insulation layer disposed between the shield layer and the data voltage transmission line,
wherein a second contact hole is defined in the first insulation layer and the second insulation layer, and
wherein the data voltage transmission line is connected to the data line through the second contact hole.

18. The display device of claim 17, wherein
an opening is defined in the shield layer,
wherein the opening surrounds the second contact hole.

* * * * *